(12) United States Patent
Nelson et al.

(10) Patent No.: US 6,386,120 B1
(45) Date of Patent: May 14, 2002

(54) ELECTRICAL CABINET HAVING A PIVOTING PLATFORM

(75) Inventors: Erik Nelson; Jeffrey Teachout, both of Upton, MA (US)

(73) Assignee: EMC Corporation, Hopkinton, MA (US)

( * ) Notice: Subject to any disclaimer, the term of this patent is extended or adjusted under 35 U.S.C. 154(b) by 88 days.

(21) Appl. No.: 09/107,056

(22) Filed: Jun. 30, 1998

(51) Int. Cl.[7] ................................................. A47B 3/00
(52) U.S. Cl. ..................................... 108/134; 312/321.5
(58) Field of Search ........................... 312/223.1, 223.2, 312/321.5, 328; 361/680, 683, 724; 108/38, 42, 50.01, 50.02, 134; 298/252, 201

(56) References Cited

U.S. PATENT DOCUMENTS

| | | | |
|---|---|---|---|
| 1,715,538 A | | 6/1929 | Dean et al. |
| 1,790,468 A | * | 1/1931 | Frank et al. ................. 108/134 |
| 2,031,287 A | * | 2/1936 | Swanson ..................... 108/134 |
| 3,813,074 A | * | 5/1974 | Mulvaney ................... 248/452 |
| 4,524,496 A | | 6/1985 | Tehsildar et al. |
| 5,281,018 A | * | 1/1994 | Cullinan ..................... 312/223.2 |
| 5,299,722 A | | 4/1994 | Cheney |
| 5,388,032 A | * | 2/1995 | Gill et al. ................... 361/727 |
| 5,588,259 A | * | 12/1996 | Kolefas ....................... 49/394 |
| 5,639,002 A | | 6/1997 | Weitbrecht et al. |

* cited by examiner

Primary Examiner—Peter M. Cuomo
Assistant Examiner—Jerry A. Anderson
(74) Attorney, Agent, or Firm—Daly, Crowley & Mofford, LLP

(57) ABSTRACT

An electrical cabinet stores, or houses, a variety electrical components. The electrical components within the cabinet may be interconnected and may be connected to other electrical components external to the cabinet. The cabinet has an access door with a door stop that allows the door to be locked in an open position. The cabinet contains a workstation with a pivoting platform that supports an electrical component. The cabinet has an extendable bracket that extends allows an electrical component to be extended from the cabinet and removed by lifting the component in an upward direction. The cabinet has a board guide module that aligns a circuit board with an electrical connector in the cabinet. The cabinet has a bulkhead connector that reduces electromagnetic degradation in electrical cables that extend from the cabinet.

9 Claims, 25 Drawing Sheets

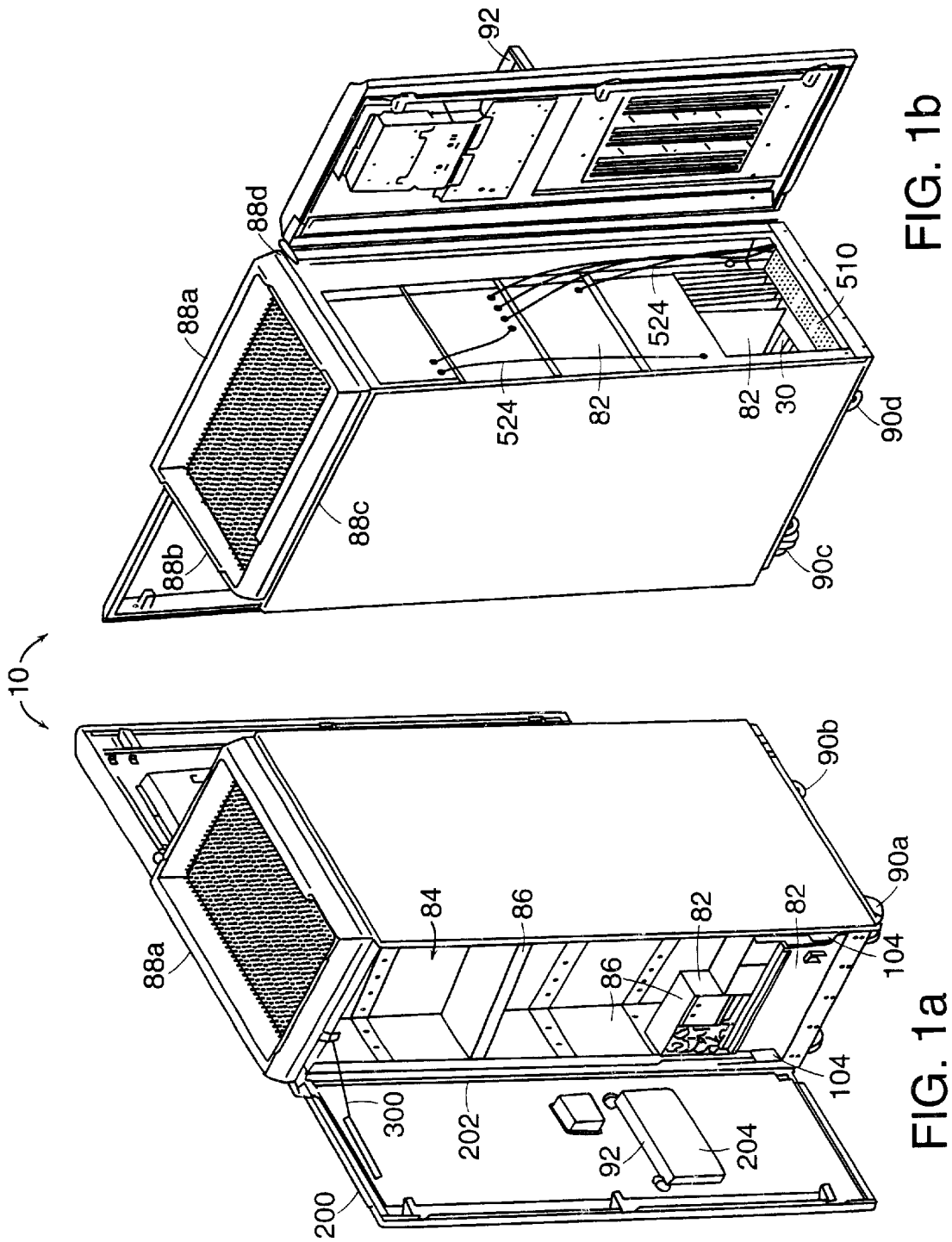

ELECTRICAL CABINET HAVING A PIVOTING PLATFORM

BACKGROUND OF THE INVENTION

The invention relates generally to electrical cabinets adapted to store, or house, electrical components, and, more particularly to electrical components used in data storage and transfer systems.

As is known in the art, electrical cabinets are used to store, or house, a variety electrical components such as printed circuit boards, batteries, cables, data servers, laptop computers, and other processing units. The electrical cabinets allow the components within the cabinet to be interconnected and also allow the internal components to be connected to components external to the cabinets. The cabinets typically have an access door and a number of compartments to store the various components. A remote workstation or laptop computer may be provided at the cabinet to assist with on-site repair or other functions. In addition, the individual components within the cabinet may be replaced or removed to a different location for repair.

A workstation may include a platform mounted to the access door that supports, e.g., a laptop computer. The platform pivots to allow the laptop computer to extend horizontally during use and to retract to a vertical position during storage. When in the vertical position, the platform does not interfere with the movement of the access door, and the access door closes completely. However, the platform pivots from the vertical position downward. Thus, the platform occupies the space in the door above the extended, horizontal platform. The position of the stowed platform may interfere with the placement of air-vents in the access door and may disrupt airflow through the cabinet.

SUMMARY OF THE INVENTION

In accordance with the invention, a cabinet is adapted for storage of electrical components. The cabinet includes a platform to support one of the electrical components. A hinge attaches to the platform to the cabinet, and the platform is rotatable about the hinge between an extended position and a retracted position. The platform pivots downward from the extended position to the retracted position.

The platform has a support the secure the platform in the extended position. The support includes a brace. An end of the brace attaches to a bottom of the platform when the platform is in the extended position. Another end of the brace contacts the cabinet when the platform is in the extended position. At least one end of the brace is detachable to allow the platform to pivot.

One preferred embodiment of the invention includes the several features. The platform is attached to the door. The door defines a recess that contains the support when the platform is in the retracted position. A set of brackets attach the corners of a laptop computer to an upper surface of the platform. The platform is horizontal when in the extended position and is vertical when in the retracted position. The support includes a cane-shaped slot that support the platform in the extended position. The terminal end of the cane-shape slot supports the brace when the platform is in the extended position.

Each embodiment of the invention may include one or more of the following advantages. The platform does not obstruct structures of the cabinet located above the platform. The platform does not obstruct airflow above the platform. The platform provides a stable workstation. The platform has minimal vertical movement when extended.

BRIEF DESCRIPTION OF THE DRAWINGS

FIGS. 1A and 1B are isometric views from a rear and front perspective, respectively, of an electrical cabinet according to the invention;

FIG. 20B is a top view of the hook of FIG. 20a;

FIG. 20C is a side view of the hook of FIG. 20a;

FIG. 20D is an view of the hook of FIG. 20a;

FIG. 22 is an isometric view of a bulkhead connector for use with the frame of FIG. 21a;

FIG. 23 is an isometric view of a bulkhead connector for use within the frame of FIG. 21a;

DESCRIPTION OF THE PREFERRED EMBODIMENTS

Figure 2A:
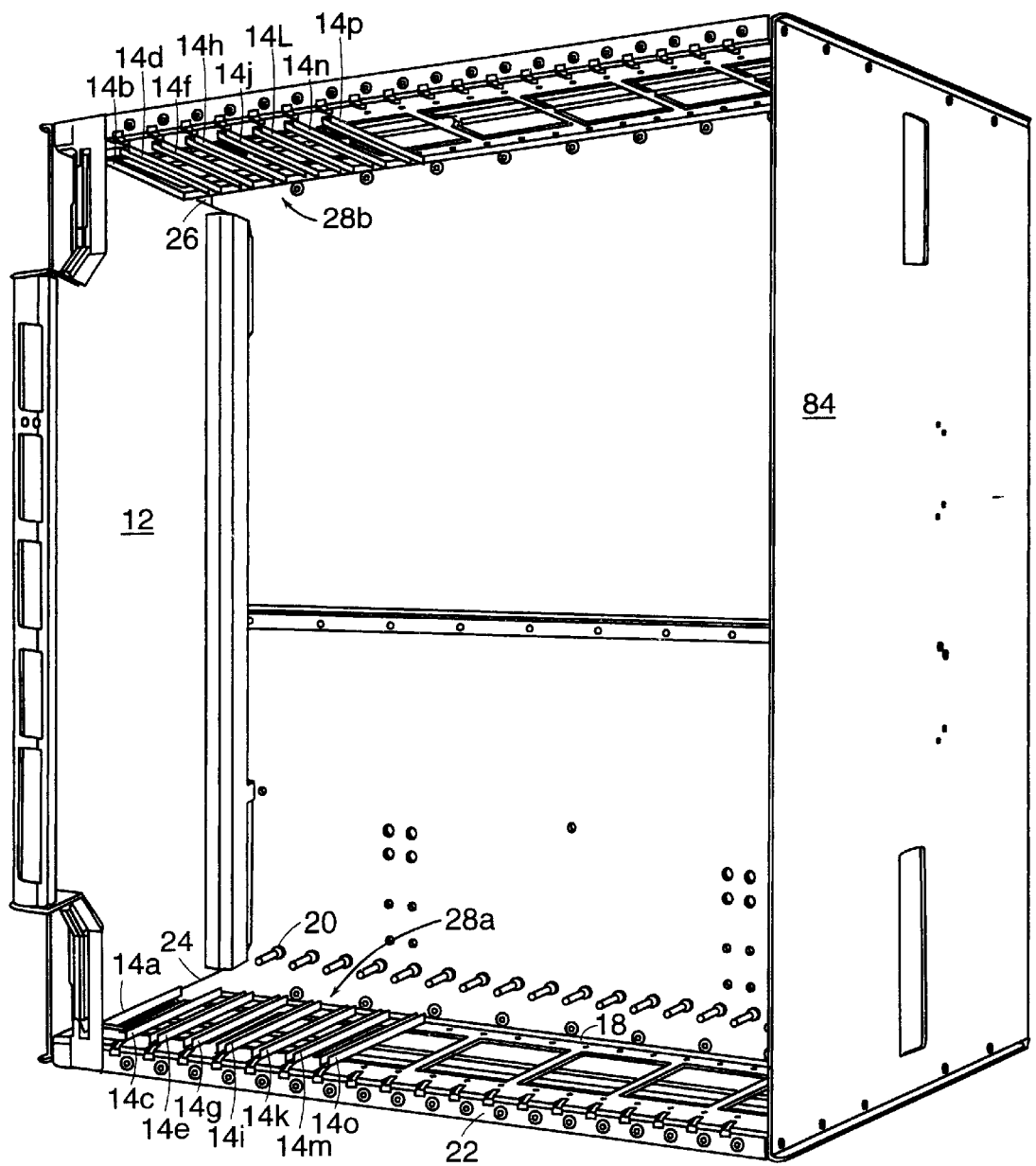
FIG. 2A is an isometric view of a storage compartment of the electrical cabinet of FIGS. 1A and 1B, such storage cabinet having an array of guide slots adapted to receive printed circuit boards according to the prior art.

Referring to FIGS. 1a–1b, an electrical cabinet 10 is adapted for the storage and operation of electrical components 82, particularly, data storage and transfer technology. For example, electrical components 82 include CPUs, printed circuit boards, batteries, cables, data servers, and laptop computers. Typically, the electrical components 82 are interconnected within the cabinet, are interconnected with other components in other electrical cabinets, or are interconnected with other networks. The electrical components 82 reside within various storage compartments 84 within the cabinet 10. The cabinet 10 has internal partitions 86 that define the storage compartments 84.

The electrical cabinet 10, has four side-walls 88a–88d. At least one of the side-walls 88 forms an access door 200. The door 200 rotates about a hinge 202 from an open position to a closed position. The cabinet 10 stands upright on four wheels 90a–90d and is mobile. The cabinet 10 includes a printed circuit board module 30, extendable brackets 104, a pivoting platform 204, a doorstop mechanism 300, and a bulkhead connector 510. The cabinet 10 also has two workstations 92 that allow an operator to perform diagnostic, repair, or other activities at the location of the cabinet 10.

Printed Circuit Board Module

Figure 2B:
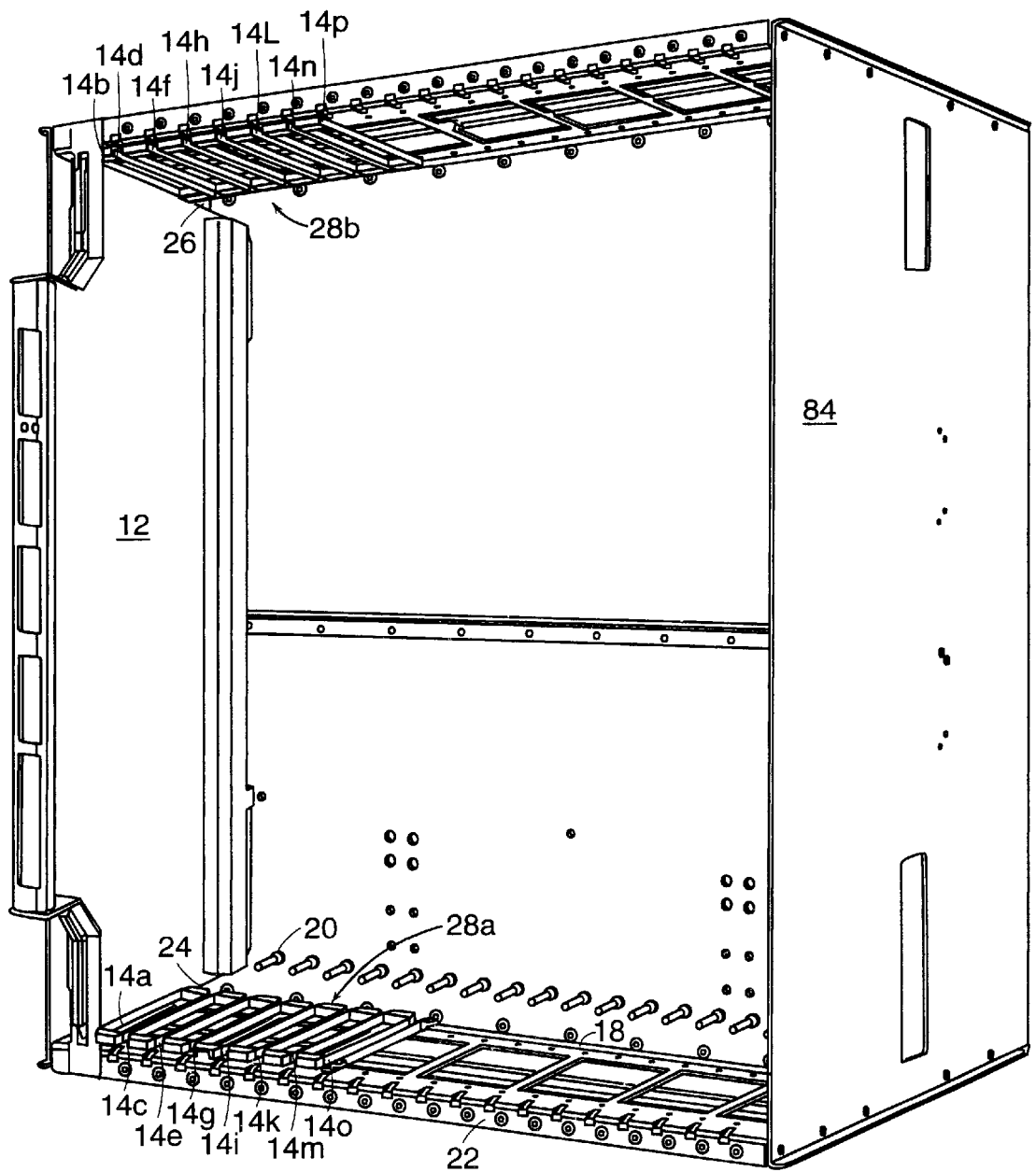
FIG. 2B is an isometric view of a storage compartment of the electrical cabinet of FIGS. 1A and 1B, such storage cabinet having an array of guide slots adapted to receive printed circuit boards according to the invention.
Figure 2C:
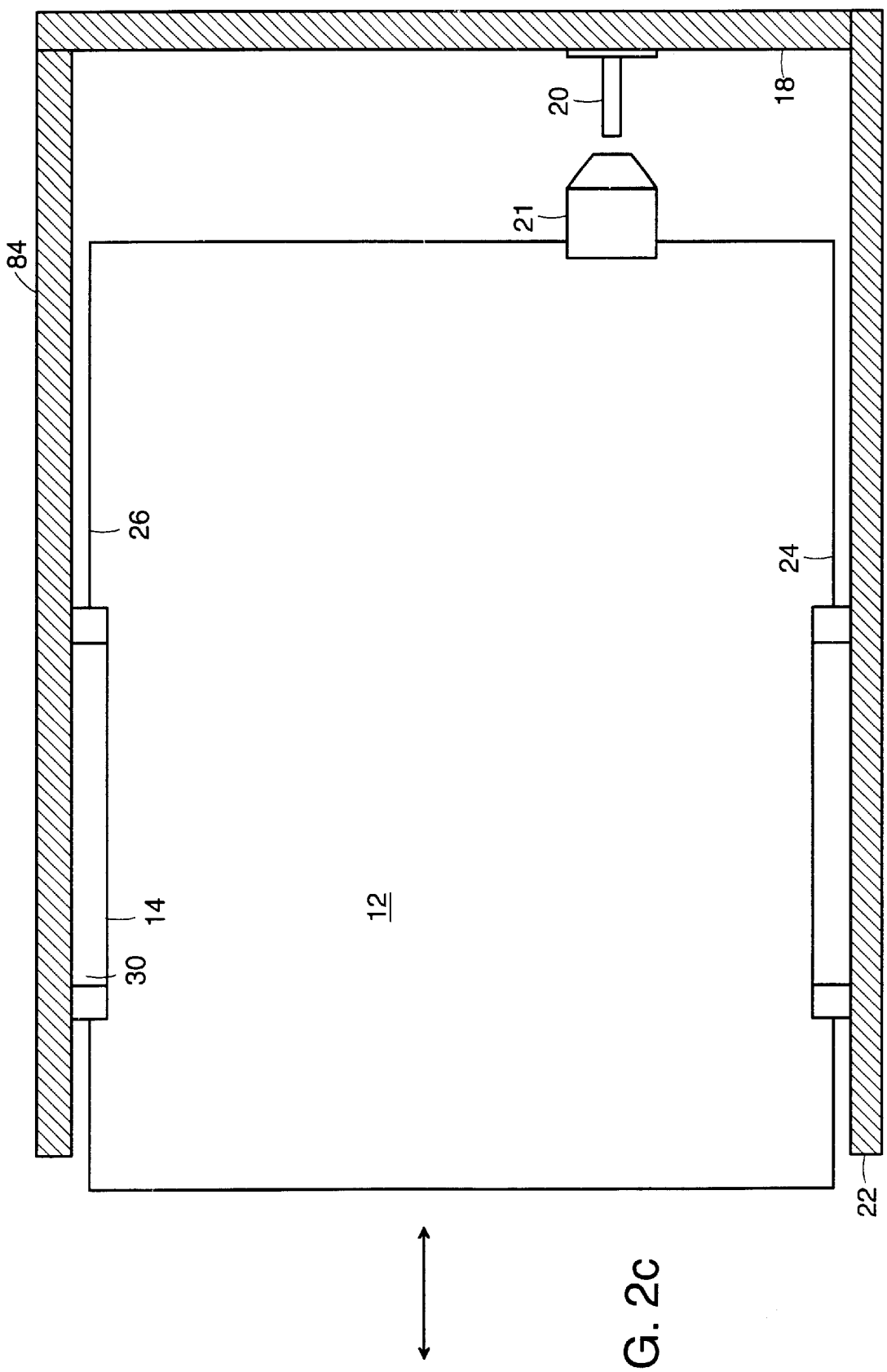
FIG. 2C is a cross-sectional side view of a storage compartment of the electrical cabinet of FIGS. 1A and 1B, such storage cabinet having a printed circuit board partially extended into a guide slot according to the invention.

Referring also to FIGS. 2a–2c, the cabinet 10 is adapted for storage of electrical components 82. The components 82 may be electrically interconnected to a plurality of printed circuit boards 12 (PCBs) that are housed in storage compartment 84. The storage compartment 84 includes an array of slots 14a–14p to secure the PCBs 12. Each one of the PCBs 12 has a female connector 21 oriented toward the back 18 of the cabinet 10. The cabinet 10 also contains a series of male connectors 20 along the back 18 of the cabinet 10. The male connectors 18 align with the female connectors 21 when the PCBs 12 are inserted into the array of slots 14a–14p.

In operation, the bottom edge 24 of one PCB 12 resides in one of the slots 14, e.g., slot 14a. The top edge 26 of the PCB 12 resides in a complimentary slot 14, e.g., 14b. The PCB slides from the front 22 of the cabinet 10, along the slots 14a–14b, and toward the back 18 of the cabinet 10. When fully inserted, the female connector on the PCB 12 aligns with and engages the male connector 20.

However, e.g. showing FIG. 2a, the inventors have discovered that existing slots 14, e.g., slots 14i–14f of FIG. 2a, allow the PCB to be misaligned when it is fully inserted. For example, the slots 14 are laterally aligned such that a space 28a exists between slot 14i and slot 14k and a space 28b exists between slot 14j and slot 14l. If the PCB 12 is inserted between two slots 14 in the spaces 28a and 28b, the connector 20 will not align with the connector 21 on the back of the PCB 12. In addition, if either a top edge 26 or a bottom edge 24 of the PCB 12 is inserted into one of the slots 14 while the opposite edge 24, 26 is inserted into one of the spaces, the PCB 12 and the connector 20 of the cabinet 10 will not align. If the PCB 12 is out of alignment, the connectors 21 on the PCB 12 or connectors 20 in the cabinet 10 may bend when the PCB 12 is fully inserted.

Figure 3:
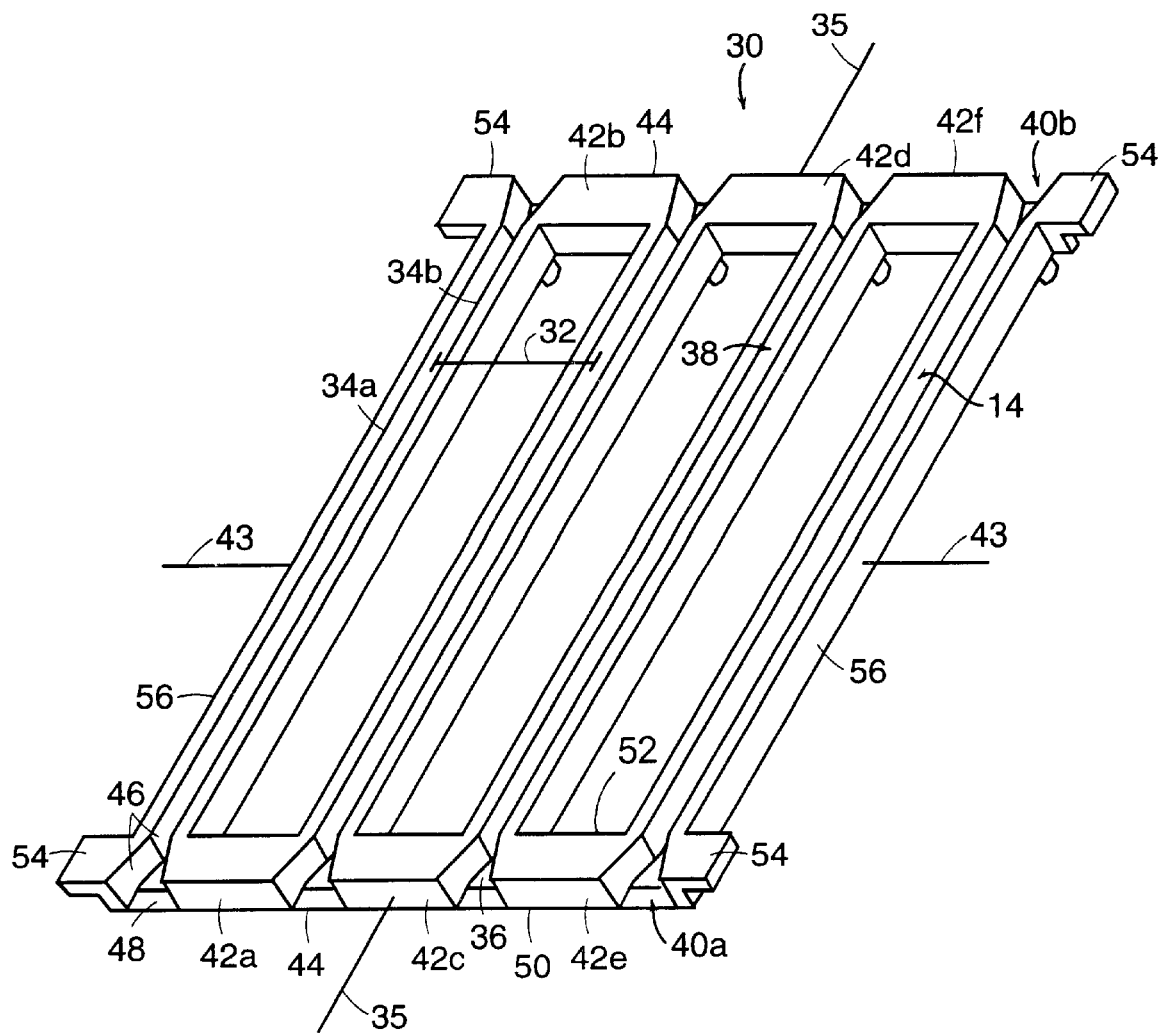
FIG. 3 is an isometric view of a module according to the invention, such module having a plurality of guide slots for receiving printed circuit boards, such module being adapted for mounting to a side of the storage compartment of FIG. 2B.
Figure 4:
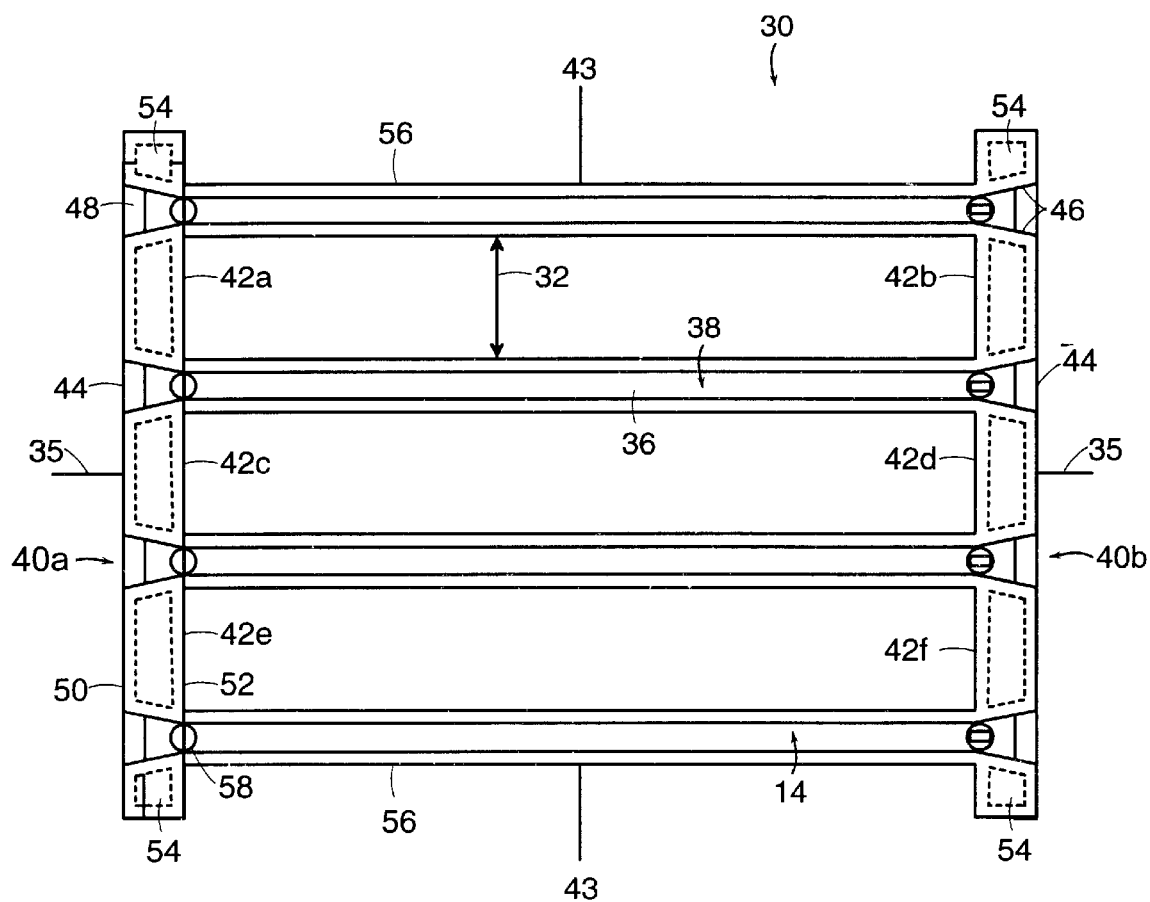
FIG. 4 is a top view of the guide module of FIG. 2.

However, referring also to FIGS. 3 and 4, a board module 30 has an array of slots 14 and an array of stop members 42 disposed between the slots 14. The board module 30 is integrally formed of a single piece of material. For example, the board module 30 can be injection molded from a suitable plastic. The board module 30 may be constructed of a conductive material such as nylon to facilitate electrostatic discharge protection.

The slots 14, here four slots 14 being shown, are parallel to each other and are oriented in a longitudinal direction 35. The slots 14 are laterally spaced. The slots 14 are equidistant, e.g., each slot has a lateral spacing 32 of 0.8" when measured from the center of each slot 14. Each slot 14 has two opposed and continuous sidewalls 34a–b that are 0.188 inches in height. The slots 14 have a continuous base 36 extending between the sidewalls 34. The width of the slots 14 between the opposing sides 34a–34b, i.e., the width of the base 36, is approximately equal to the width of a PCB 12. For example, the width is 0.120". The slots 14 are open along the top 38 of the board module 30 and the slots have open ends 40a–40b. The slots extend 4.033" from end 40a to end 40b.

The ends of the slots 14 are flared, i.e., the internal width of each slot 14 at ends 40a–40b are wider than the width of the slot 14 at a point between the ends 40a–40b. The openings 40 of the slots 14 are 0.243" and the width of the slot 14 is narrowed along constant slopes 46 to a minimum width of 0.120". Similarly, the base 36 is flared. The base 36 extends from a point at each end 40a, 40b. The thickness of the base 36 increases to a depth of 0.047". The thickness increases along a constant slope 48 that extends 0.102" into to slot 14.

The board module 30 has a plurality of stop members 42a–42f extending in a lateral direction 43. Each stop member is disposed between corresponding pairs of adjacent slots 14 and is connected to the adjacent slots 14. For example, stop member 42a is disposed between slot 14a and slot 14c. The stop members are 0.273" when measured in the longitudinal direction. The stop members 42 lie at 90° angles to the slots 14, and the stop members 42 are flush with the ends 40a, 40b of the slots 14. Therefore, when viewed from above the board module 30, the stop members 42 and the ends 40 of the slots 14 form a continuous straight line along both ends 44 of the board module 30. Because the openings 40 of the slots 14 are flared, the outer edge 50 of the stop members 42 is shorter than the inner edge 52.

The board module 30 also has four end members 54. The end members 54 extend laterally from the outer sides 56 of the board module 30 and are aligned with the stop members 42. The end members 54 are stop member. However, the length of the end members 54 in the lateral direction is one-half the length of the stop members 42. Therefore, when two board modules 30 are positioned side by side, the adjacent end members 54 have the same length as a single stop member 42.

Figure 5:
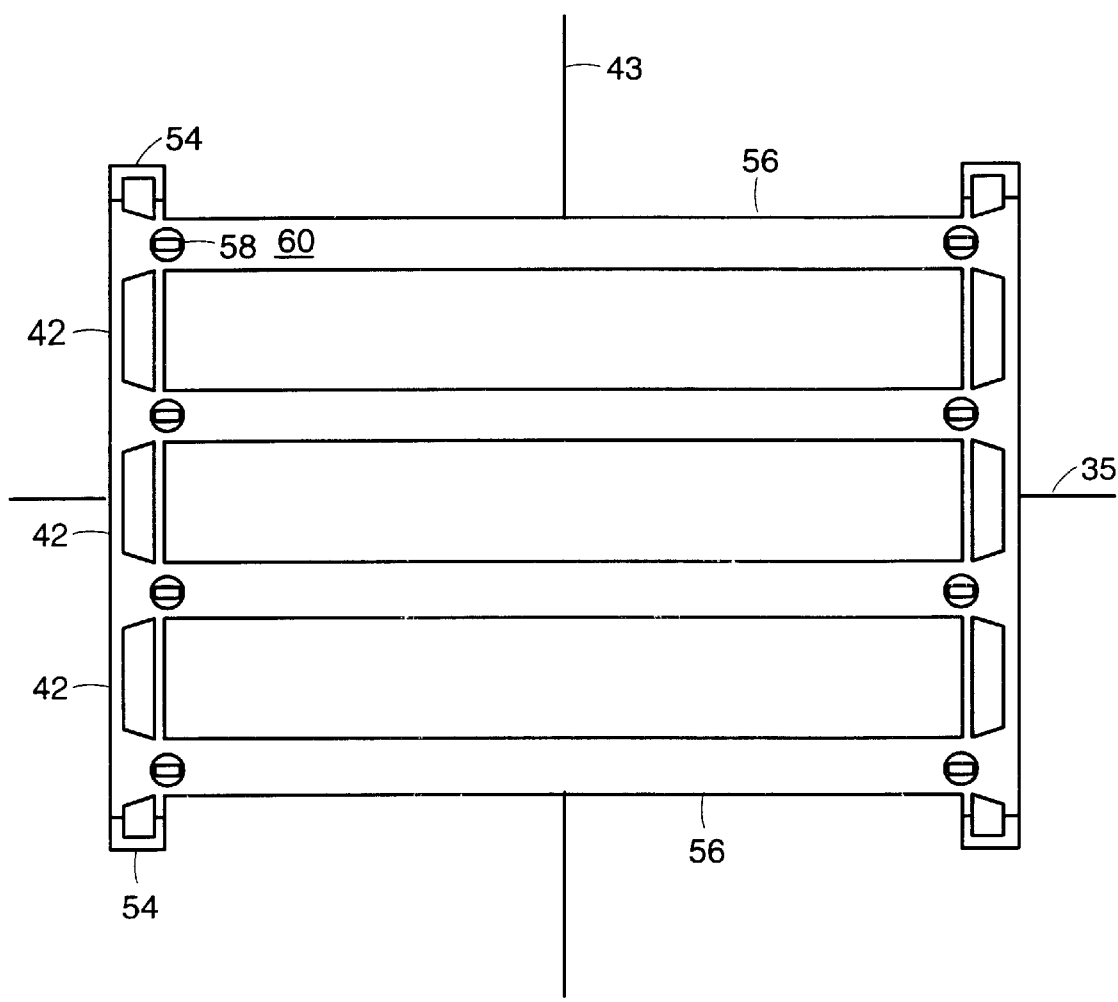
FIG. 5 is a bottom view of the guide module of FIG. 2.
Figure 6:
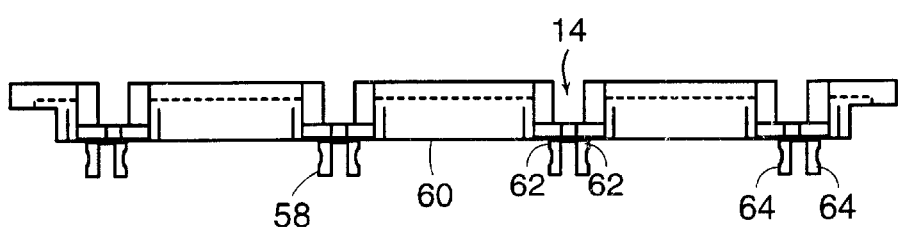
FIG. 6 is an end view of the guide module of FIG. 2.

Referring also to FIGS. 5–6, a set of eight securing pins 58 extend downward 0.14" from the bottom 60 of the board module 30. Each pin 58 consists of two parallel flexible members 62 that are spaced 0.05" apart. A barb 64 is located at the end of each flexible member 62. Each barb 64 has a radius of 0.07".

The structure of the board module 30 is symmetrical. The board module 30 is symmetrical about the bisecting axis 35 that defines the longitudinal direction, and the board module 30 is symmetrical about the bisecting axis 43 that defines the lateral direction. In addition, the board module 30 has the same relative structure when rotated 180° in the horizontal plane defined by the longitudinal and lateral axes. In other words, the board module 30 has the same appearance regardless of which end 44 faces the front 22 of the cabinet 10.

In operation, the board module 30 resides in the electrical cabinet 10. The pins 58 extend into corresponding holes (not shown) located in the cabinet 10. The barbs 64 engage the holes and pinch the flexible members 62 together. When fully inserted, the flexible members 62 expand and the barbs 64 oppose motion of the board module 30 away from the cabinet.

Figure 7:
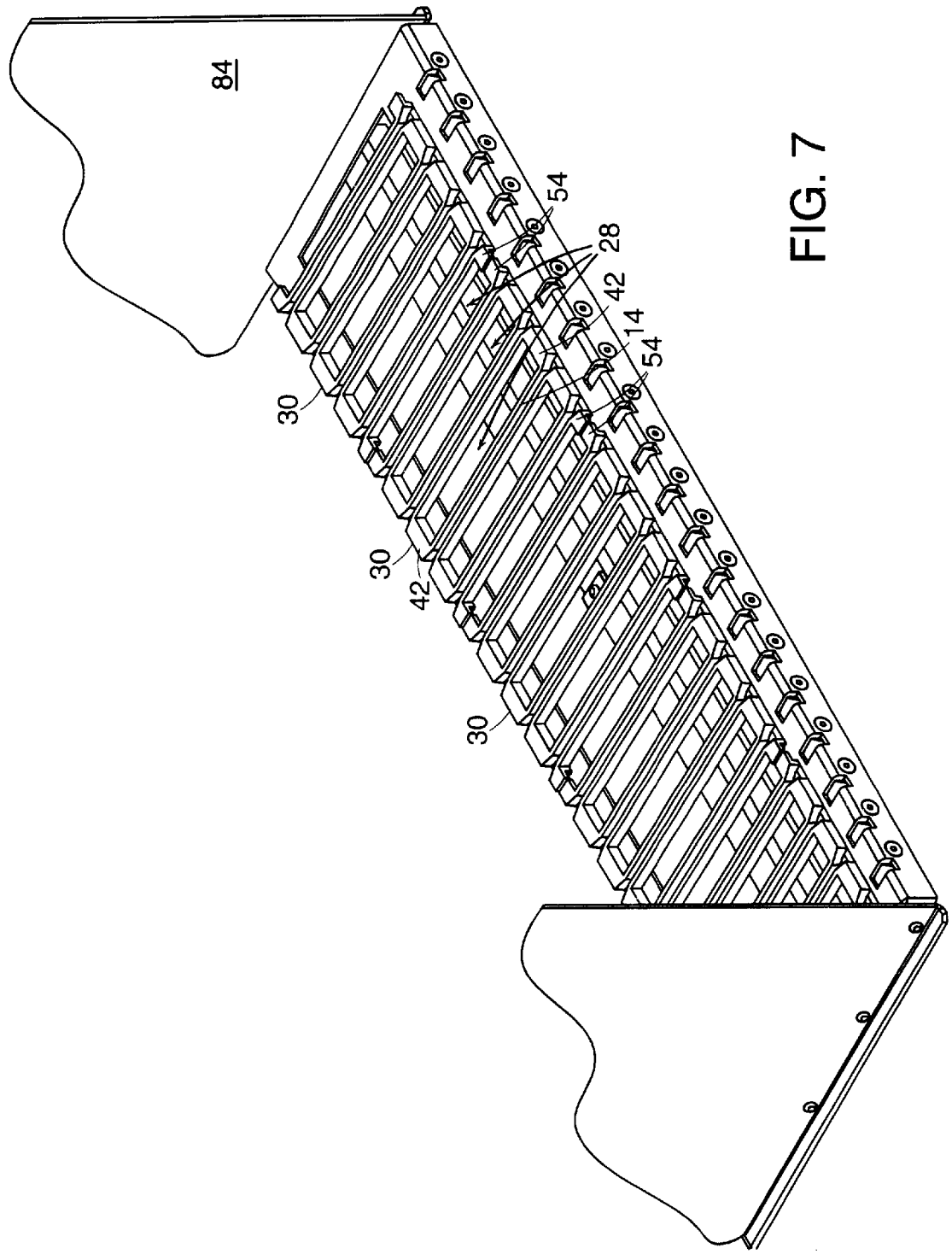
FIG. 7 is an isometric view of a portion of the cabinet of FIGS. 1A and 1B showing a plurality of guide modules according to the invention mounted to a side of the cabinet of FIGS. 1A and 1B.

Referring also to FIG. 7, a series of board modules 30 reside in a row within the cabinet 10. The end members 54 of one board module 30 are adjacent to the end members 54 of the next board module 30 in the series. Therefore, each pair of slots 14 in the array has the same lateral spacing 32. The stop member 42 and the end members 54 obstruct all the spaces 28 between the slots 14. Therefore, when a PCB 12 resides within the cabinet 10, it cannot slide into any of the spaces 28. In addition, the length of the board module 30, when measured in the longitudinal direction 35, is smaller than the length of a typical PCB 12. Therefore, the PCB 12 cannot fall between the spaces 28 bounded by the stop members 42 and any two adjacent slots 14.

Other embodiments are within the scope of the invention. The dimensions provided are for example only and correspond to a board module that accommodates a 3/32" thick PCB. Other dimensions are possible to accommodate a 3/32" PCB or other PCBs. In addition, the number of slots may range from one to any suitable number. Board modules having different numbers of slots can be combined in operation. The spacing of the slots may vary. The stop members can extend between the slots at points between the ends of the slots. The stop members can extend transversely at angles other than 90° to the slots. Only one stop member can be disposed in a corresponding space between slots, or more than two stop members can be placed within a corresponding space between slots. The end members can have varied lengths. For example, one end member may be one third the distance between slots while the adjacent end member may be two thirds the distance between the slots. The board module can be formed of several disassociated pieces rather than one integral piece. Other configurations of connectors may be used. For example, the PCB 12 may contain the male connector 18, or the connectors may include an array of pins rather than a single pin.

Extendable Battery Bracket

Figure 8:
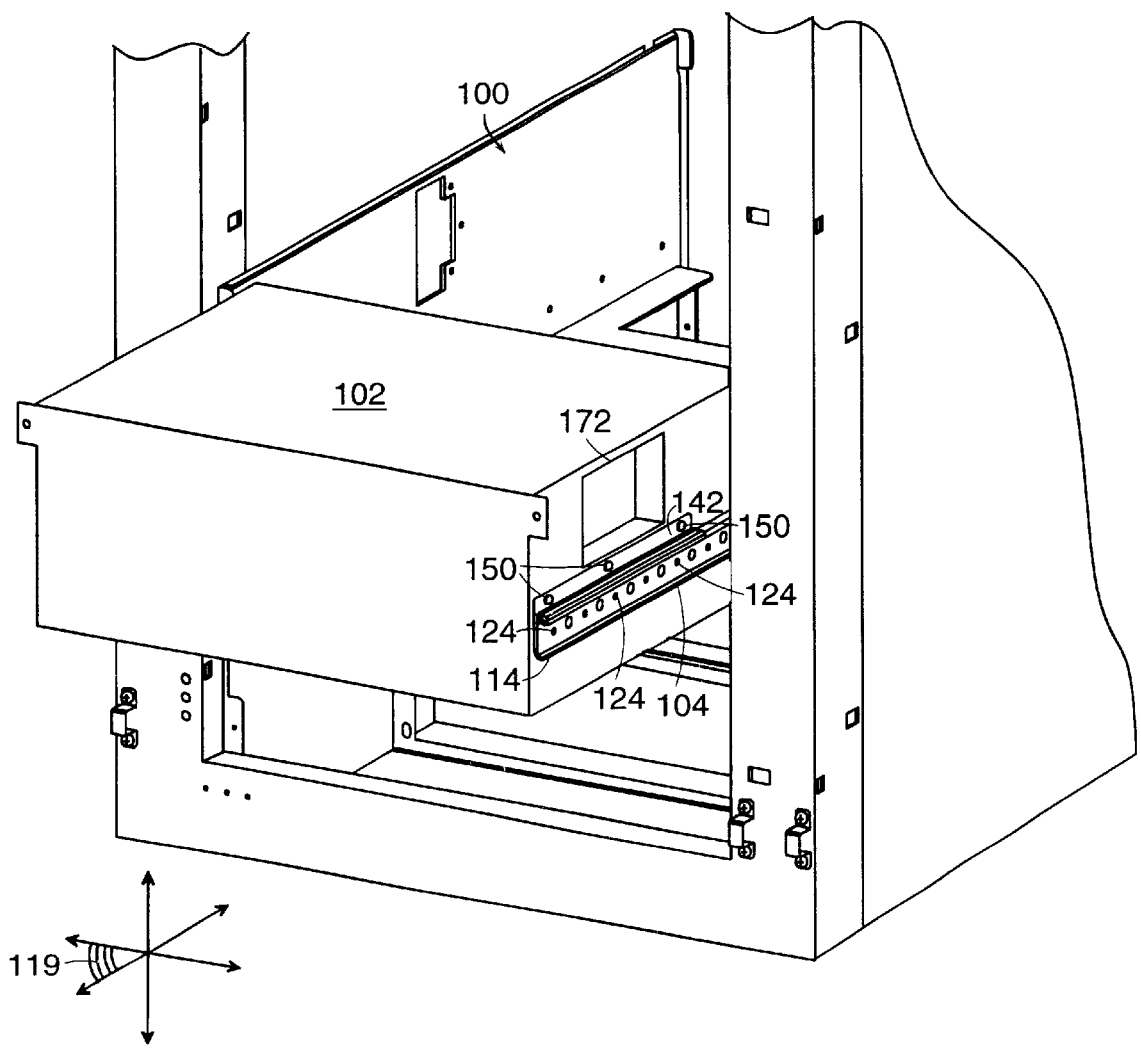
FIG. 8 is an isometric view of a portion of the cabinet of FIGS. 1A and 1B showing a battery adapted to power electrical components housed in such cabinet, such battery being mounted to the cabinet with a battery mounting bracket according to the invention.

Referring to FIG. 8, the electrical cabinet 10 has a storage compartment 100 adapted for the storage of a battery 102. The battery 102 provides power to the electrical components. Typically, the battery 102 is a backup power source.

Figure 9:
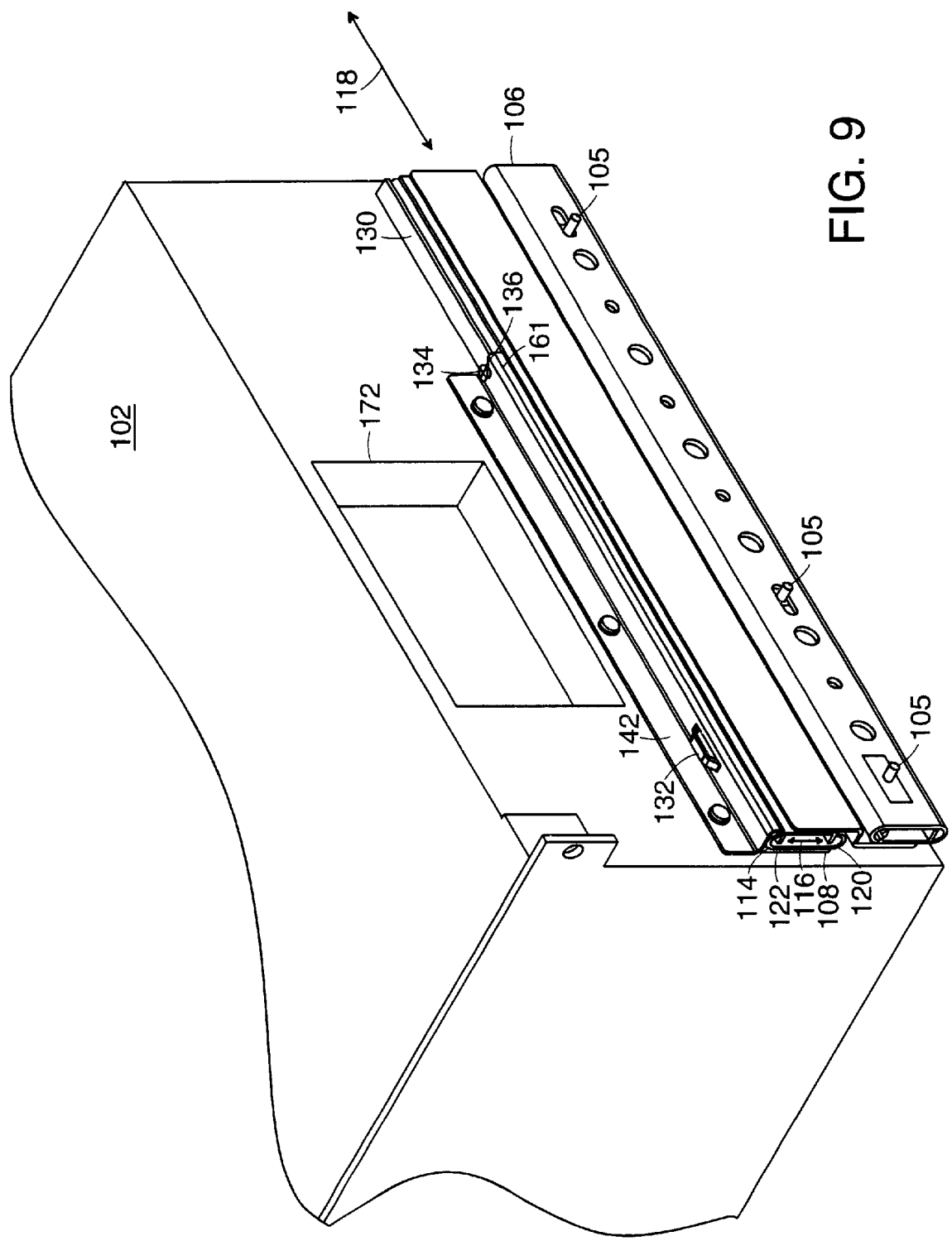
FIG. 9 is an isometric view, partially broken away, of the battery and mounting bracket of FIG. 8.
Figure 10:
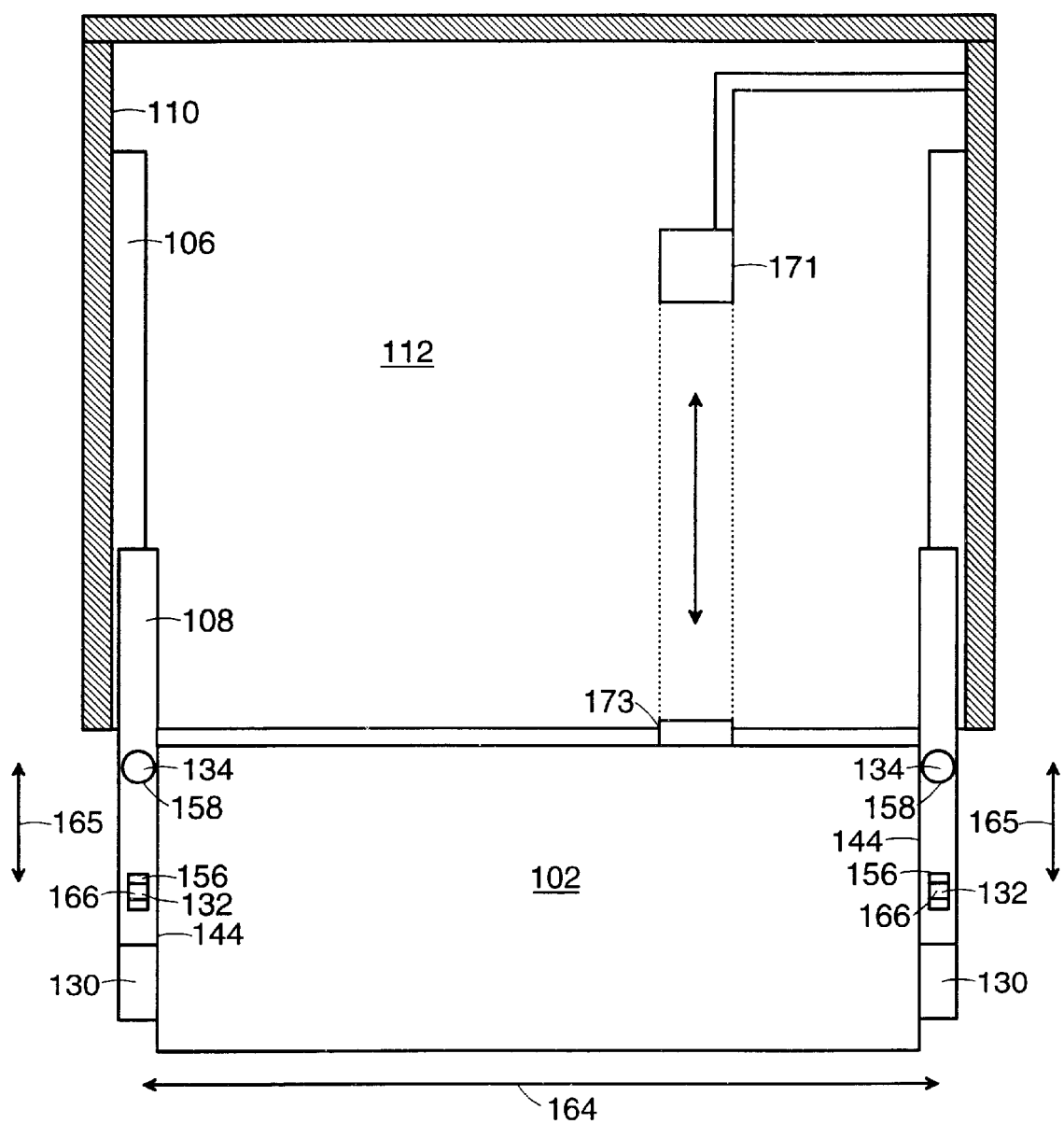
FIG. 10 is a top view of the battery and the brackets of FIG. 8.

Referring also to FIGS. 9–10, a pair of brackets 104a–104b supports the battery 102 within the storage compartment 100. The brackets 104a–104b are elongated and extendable. The brackets 104a–104b are effectively the mirror image of each other. Each bracket 104 has a set of three pins 105 that mount the brackets 104 to opposing sides 110 of the storage compartment 100. Each bracket 104 is at the same height relative to the bottom 112 of the cabinet 10, and the brackets 104 are parallel to one another. The brackets 104 support the battery 102, which is disposed between the brackets 104.

The brackets 104 are extendable through a range of positions from a retracted position within the cabinet 10 to a an extended position that is external to the cabinet 10. Therefore, each bracket 104 has a stationary section 106 and an extendable arm 108. The stationary section 106 mounts to the side 110 of the storage compartment 100. The extendable arm 108 attaches to stationary section 106 but the extendable arm 108 moves relative to the stationary section 106 in the direction of elongation 118. Typically, the pair of brackets 104 extends horizontally.

To facilitate extension and retraction, the extendable arm 108 has two curved edges 114 that extend parallel to each other in the elongate direction 118. The edges 114 wrap around the width 116 of the stationary section 106 and oppose motion of the members 106, 108 relative to one another in directions other than the elongate direction 118. Thus, the extendable arm 108 can slide over the stationary section 106 in the elongate direction 118. In addition, rollers or bearings (not shown) can be disposed between the outer surfaces of the extendable and stationary sections 106, 108 to reduce the friction as the extendable arm 106 slides relative to stationary section 108.

Figure 11:
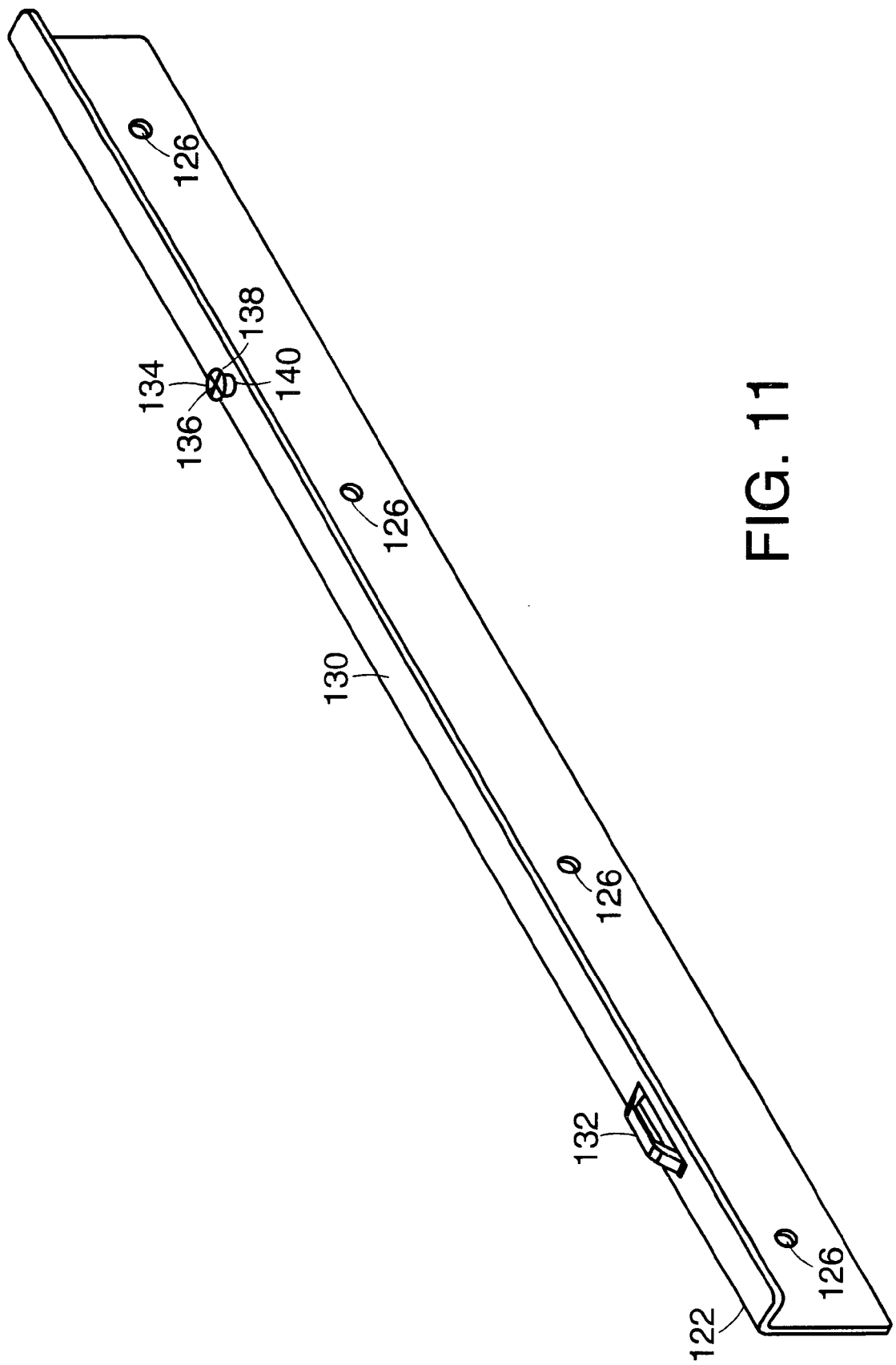
FIG. 11 is an isometric view of an extendable arm of the bracket of FIG. 9.

The extendable arm 108 includes two distinct sections: a slidable member 120 and a mounting member 122. The slidable member 120 attaches to and slides over the stationary section 106 as described above. Referring also to FIG. 11, the mounting member 122 is a separate piece that attaches to the slidable member 116 along a series of holes 124, 126. For example, four screws extend through holes 126 in the mounting member 122 and into holes 124 in the slidable member 120. The mounting member 122 is an elongated "L" shape member. The mounting member is 14" in length, 0.38" in width, and 1.27" in height.

The mounting member 122 has an upper surface 130 that includes a mounting surface 132 and a stop 134. The mounting surface 132 is a notch that extends upward from the upper surface 130. The mounting surface 132 has the shape of a trapezoid. The stop 134 is a post that extends upward from the upper surface 130. In the depicted embodiment, the post 134 is a screw 136 with a flared head 138. The screw 134 is threaded into a hole 140 in the mounting member 122.

The battery 104 has a pair of supports 142 that extend from opposing sides 144 of the battery 102. The supports 142 are an elongated "L" shaped members having a vertical section 146 and a horizontal section 148. The supports 142 are 10.17" in length. The horizontal section is 0.50" wide, and the vertical section 146 is 0.61" high. A set of three screws 150 mount each support 142 to the battery 102 along the vertical section 146. Each screw 150 extends through a hole 152 (shown in FIG. 11) and into a corresponding hole (not shown) in the side 144 of the battery 102.

The horizontal section 148 of each support 142 includes a lower surface 154, a securing surface 156, and a stop notch 158. The securing surface 156 forms a rectangular opening 160 that extends through the horizontal section 148. The opening 160 measures 0.18" by 0.87". The stop notch 158 is an indentation 162 in an end 168 of the support 142. The indentation is rounded and is approximately 0.188" in diameter. The stop notch 158 is located rearward of the opening 160. The securing surface also has a lip 161 that extends along the horizontal section 148 on the side opposite the vertical section 146. The lip 161 extends downward 0.18" at a right angle to the horizontal section 148.

A horizontal distance 164 between the openings 160 of the supports 142 is the same horizontal distance 164 between the mounting surfaces 132. Therefore, when the battery 102 is disposed between the brackets 104, the mounting surfaces 132 align with the corresponding securing surfaces 156. The lower surfaces 154 of the supports 142 rest on top of the upper surfaces 130 of the brackets 104, and the trapezoidal mounting surfaces 132 extend through the openings 160. When the mounting surface 132 mates with the securing surface 156, the surfaces 132, 156 oppose each other in the horizontal plane 119. Thus, the battery 102 does not slide relative to the extendable arm in the horizontal plane 119.

In addition, the distance between the stop 134 and the mounting surface 132 of each extendable arm 108 is approximately the same distance between the opening 160 and the stop notch 158 of each support 142. Therefore, when the battery 102 is disposed between the brackets 104, each stop 134 resides within the corresponding indentation 162 formed by stop notch 158.

Figure 12:
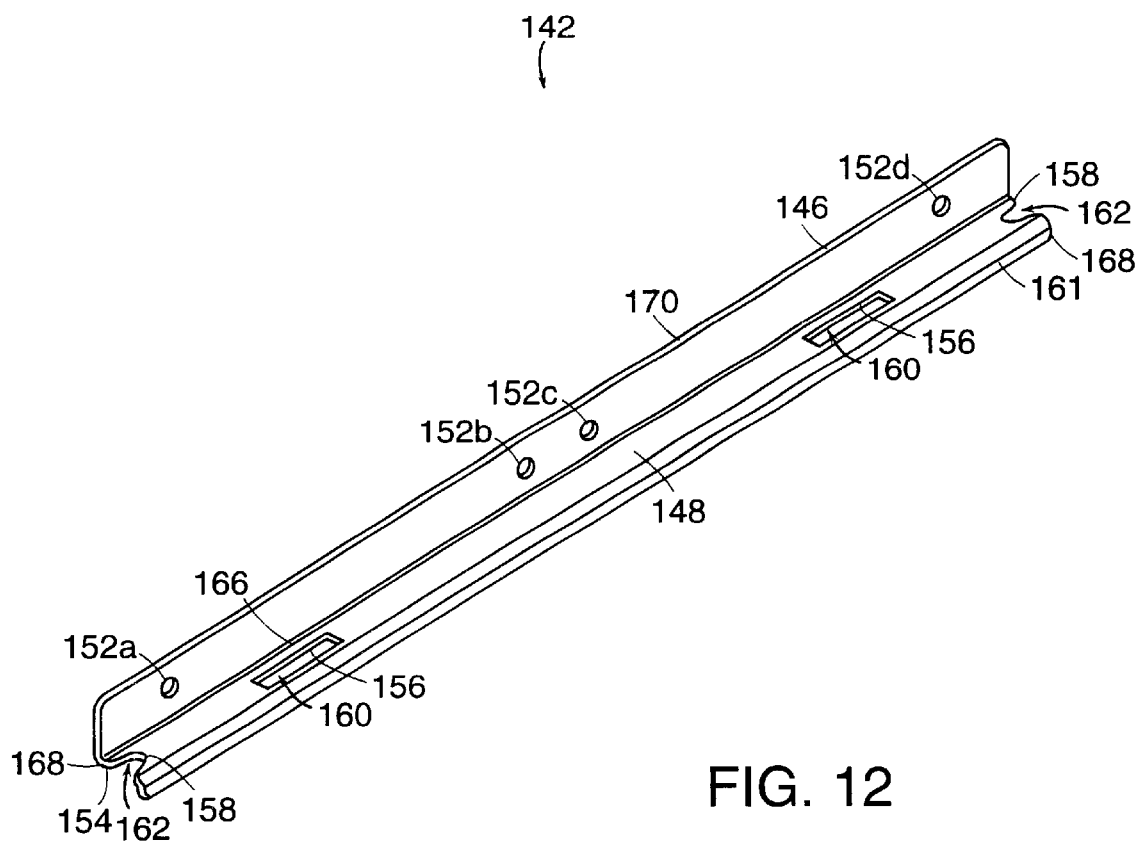
FIG. 12 is a isometric view of a support of the bracket FIG. 9.
Figure 13:
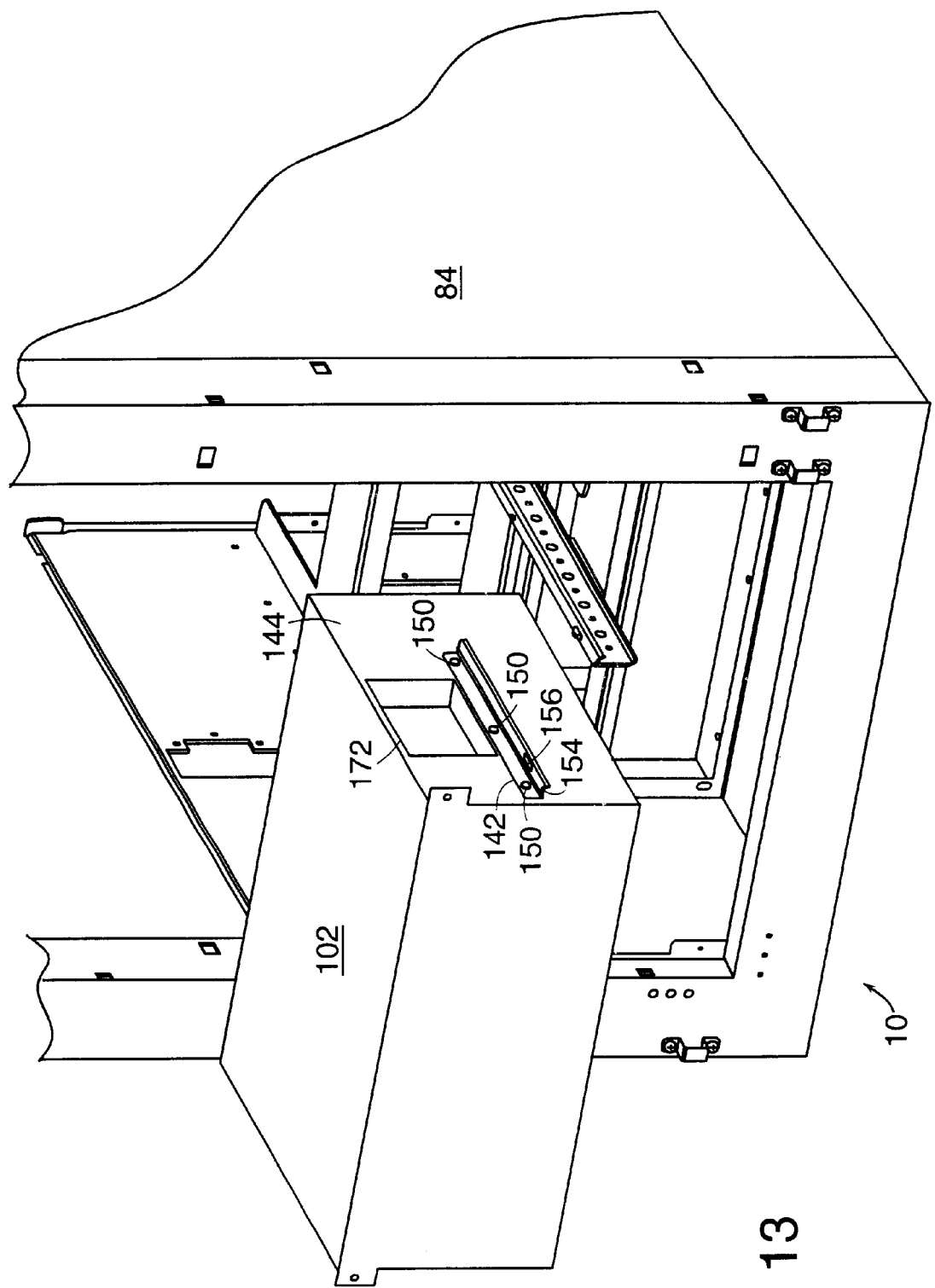
FIG. 13 is an isometric view, partially broken away, of the battery and cabinet of FIG. 8 before the battery is disposed between a pair of the brackets of FIG. 9.

Referring to FIG. 12, the support 142' is reversible, i.e., a support 142' can be mounted on either side of battery 102. Thus, two supports 142' having the same structure can secure the battery 102 between the brackets 104. The support 142' is symmetrical and includes two securing surfaces 156 and two stop notches 158 that reside at opposite ends 168 of the support 142. The center 166 of the openings 160 are 2.00" from each end 168 of securing surface 156. In addition, the support 142' has four holes 152a–152d that accommodate screws 150. The first hole 152a is 0.75" from the end 168 of the support 142. The second, third, and fourth holes 152b–152d respectively are 4.000", 4.670", and 8.670" away from the first hole 152a. The holes 152 are 0.25" from the top edge 170 of the horizontal section 148.

Referring to FIGS. 8–13, in operation, the battery 102 is disposed on between the brackets 104. The brackets 104 retract into the storage compartment 100 or extend from the storage compartment 100. In the extended position, the battery 102 is external to the storage compartment 100. In the retraced position, the battery 102 is within the storage compartment 100, and the access door (not shown) encloses the storage compartment 100. The battery 102 is adapted to automatically electrically interconnect with other components within the electrical cabinet. When the battery 102 is in the extended position, as shown in FIG. 10, the battery 102 is electrically decoupled from the cabinet. A connector 173 on the battery 102 disengages from a connector 171 in the cabinet 10. When the battery 102 is in the retracted position, the battery 102 is electrically coupled to the cabinet. The connector 173 engages with the connector 171 in the cabinet 10.

Handles 172 are integrally formed in the sides 144 of the battery 102. The handles 172 allow an operator to lift the battery 102 from the brackets 104 or place the battery 102 between the brackets 104. When the operator places the battery 102 on the brackets 104, the battery 102 descends with the stop notches 158 pointing slightly downward. Stop notches 158 initially engage stops 134. Therefore, the mounting surfaces 132 and the securing surfaces 156 are automatically aligned. The sloped shape of the trapezoidal mounting surface 132 ensures that the securing surface 156 and the mounting surface 132 mate when the battery 102 moves downward between the brackets 104.

The operator removes the battery 102 by opening the door, extending the brackets 104 from the storage compartment 100, and lifting upwards on the handles 172. No further manipulation of the cabinet 10 is necessary. However, the operator can further secure the battery if desired by rotating the stop screw 136 until the stop notch 158 is securely fixed between the head 138 of the stop screw 136 and the upper surface 130 of the extendable arm 108.

Other embodiments are within the scope of the invention. In the embodiments depicted, the slidable member 120 and the stationary section 106 are included in a bracket that is available as off-the-shelf technology. The mounting member 122 is attached at a time after manufacture. However, the slidable member 120 and the mounting member 122 can be attached during manufacture of the bracket 104 and the extendable arm 108 can be integrally formed from a single piece.

All measurements above are examples of an embodiment of the invention. Variations of the measurements will result in alternate embodiments of the invention. The extendable arm 108 can be attached to the stationary section 106 by a variety of interim members including additional extendable arms, bearings, rollers, alternate configurations of the members, or other mechanisms. The brackets can extend in planes other than the horizontal plane, and the horizontal direction requires only a horizontal component. The supports can be mounted in an alternate fashion, e.g., the supports can form a tray or platform between the brackets. The mounting member can also be reversible. The brackets can partially extend the battery from the storage compartment when in the extended position or partially retract the battery into the storage compartment when in the retracted position. The brackets can support other electrical components, e.g., data storage devices, CPUs, or laptop computers.

Extendable Platform

Figure 14:
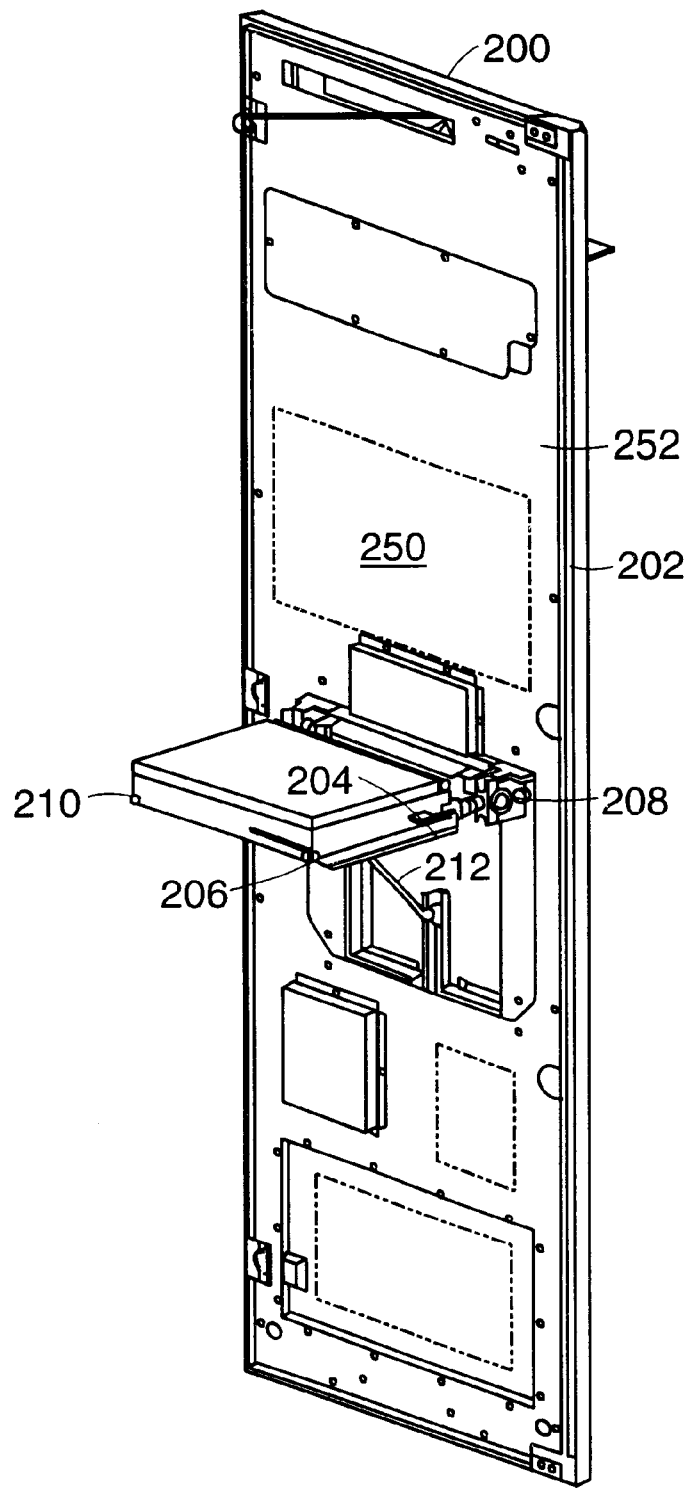
FIG. 14 is an isometric view of a laptop computer extended from a door of the electrical cabinet of FIGS. 1A and 1B, the laptop being disposed on a pivoting platform of the cabinet of FIGS. 1A and 1B.

Referring to FIG. 14, the electrical cabinet 10 includes a door 200. Hinge 202 attaches the door 200 to the cabinet 10. The door 200 rotates about the hinge 202 in the horizontal plane 119 (shown in FIG. 8) from an open position to a closed position.

The door 202 includes a recess 248, an air vent 250, and a pivoting platform 204 that supports an electrical component 228, e.g., a laptop computer. The recess 248 is a rectangular depression located on an inside 252 of the door 200. The air vent 250 is above the recess 248.

Figure 15A:
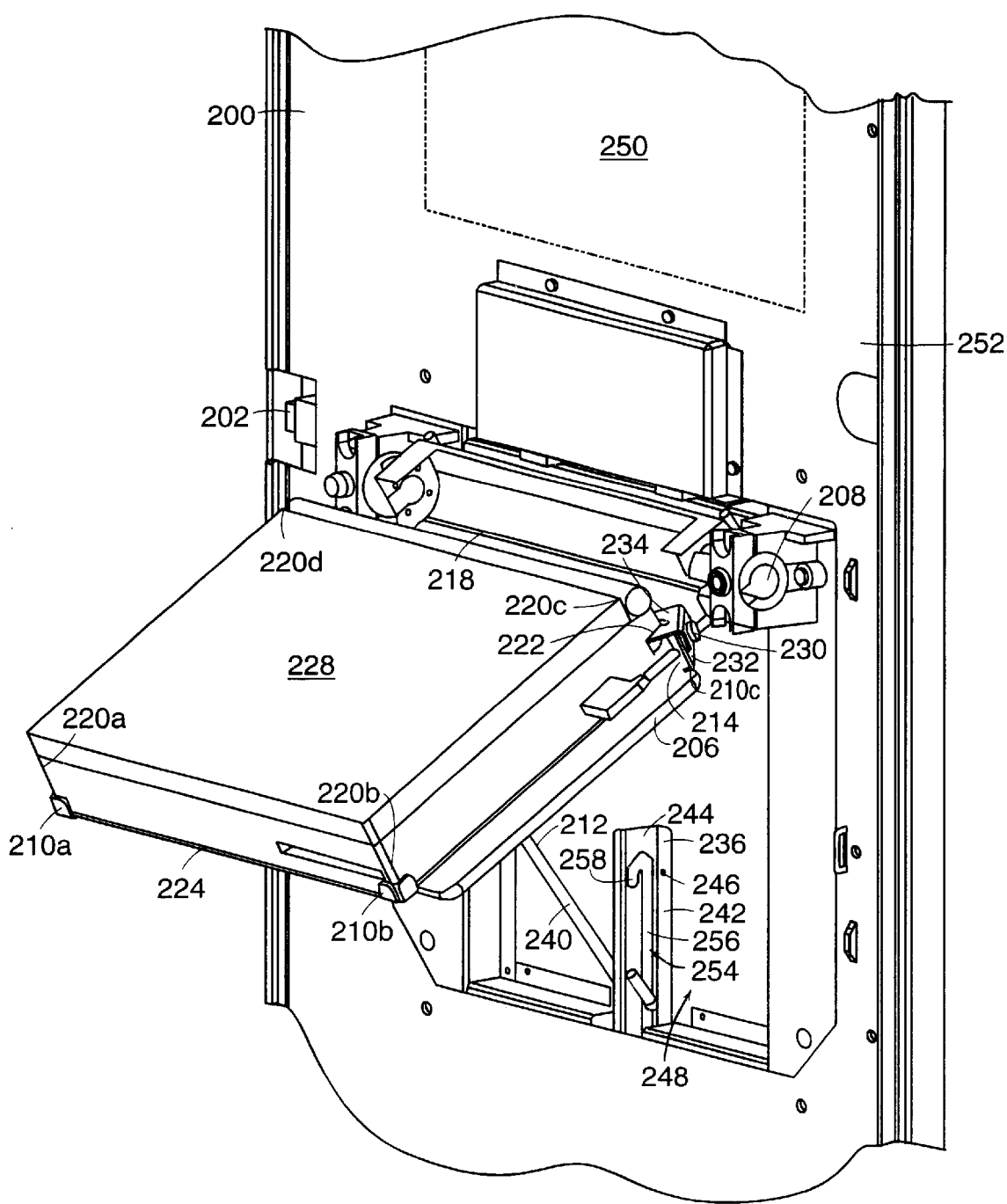
FIGS. 15A and 15B is an isometric view, partially broken away, of the laptop computer and pivoting platform of FIG. 14 shown partially extended/retracted.
Figure 15B:
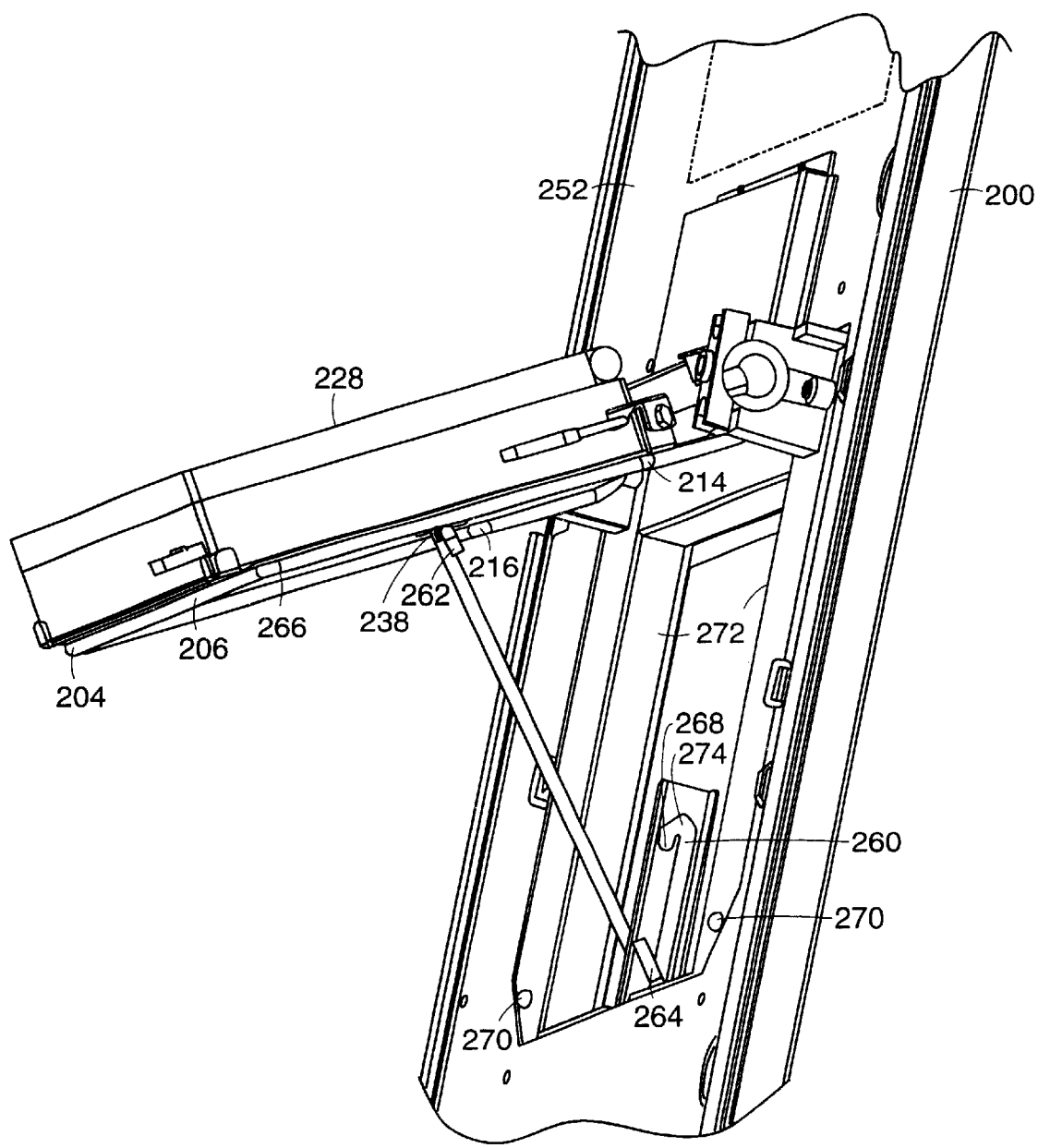
Figure 16:
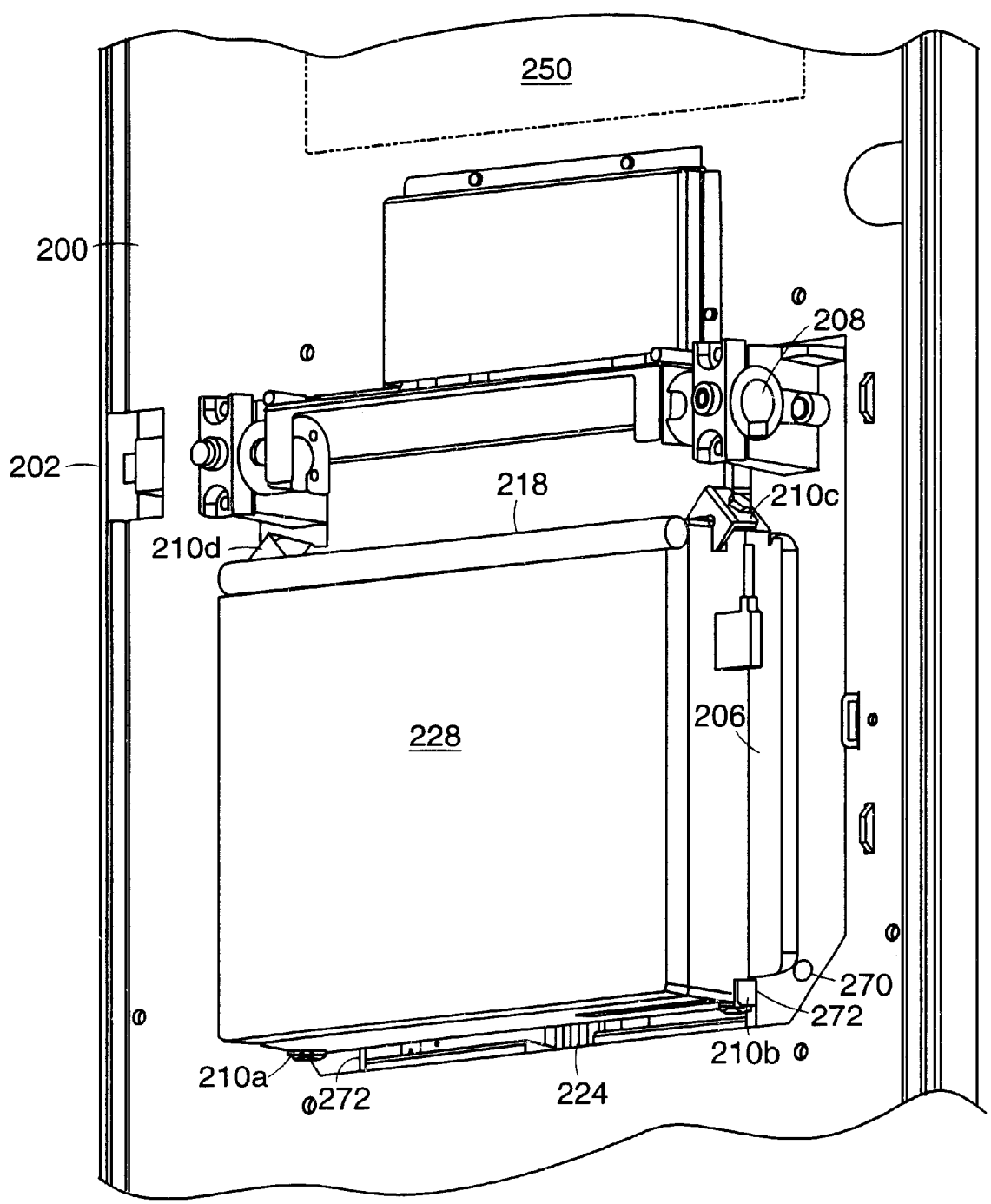
FIG. 16 is an isometric view, partially broken away, of the laptop computer and pivoting platform of FIG. 14 shown retracted against the electrical cabinet door.

Referring also to FIGS. 15a, 15b, and 16, the platform 204 includes a flat rectangular tray 206, a hinge mechanism 208, a set of brackets 210a–210d, and a support mechanism 212. The hinge mechanism 208 is on the door 200 between the air vent 250 and the recess 248. The hinge mechanism 208 attaches the tray 206 to the door 200 at the two back corners 214, 216 of the platform 204. Thus, the platform 204 attaches to the door 200 along a back edge 218 of the platform 204. The hinges 208 are level and are at approximately waist height of an average person. The hinge mechanism 208 is an "adjustable cable-supporting hinge assembly," which is described in U.S. Pat. No. 5,572,769. U.S. Pat. No. 5,572,769 is incorporated herein for reference.

The tray 206 has an upper surface 226 with an area that is roughly equivalent to the area of the laptop computer 228. Typically, the area of the platform 204 will be slightly larger than the area of the laptop computer 228. The laptop computer 228 rests upon the upper surface 226 of the tray 206. The set of four brackets 210a–210d secures the laptop 228 to the tray 206. The brackets 210 attach to the corners 220a–220d of the laptop 228. The brackets 210a–210d have inner surfaces 222a–222d that form right angles and that conform to the corners 220a–220d of the laptop 228. The two front brackets 210a–210b are "L" shaped brackets that abut the front corners 220a–220b of the laptop 228 at a front edge 224 of the tray 206.

The two back brackets 210c–210d each include a bolt 230 that connects two members: a mounting member 232 and an angled securing member 234. The mounting members 232 attach to the corners 214 of the tray 206. The mounting members 232 extend perpendicular to the tray 206 and at a 45° angle to the back edge 218 of the tray 206. The bolts 230 attach the angled securing member 234 to the mounting members 232.

The four brackets 220a–220d act as a vice to secure the laptop 228 to the tray 206. An operator rotates the bolt 230. The bolt 230 drives the angled inner surfaces 222 of the brackets 210c–210d against the back corners 220c–220d of the laptop 228. In turn, the angled inner surfaces 222 press the laptop 228 against the front brackets 210a–210b.

The support mechanism 212, in combination with the hinge mechanism 208, supports the tray 206 in an extended position (shown in FIG. 1). The support mechanism 212 includes a slotted mount 236, a connector 238, and a brace 240. The slotted mount 236 is an elongated member that has two perpendicular sections: the attachment section 242 and the slotted section 244. The attachment section 242 attaches to the door 100 at one or more attachment points 246. The attachment points 246 are, e.g., screws, bolts, or spot welds. The slotted mount 236 attaches within the recess 248 in a vertical position.

The slotted section 244 of slotted mount 236 is perpendicular to the door 100. The slotted section 244 has a cane-shaped slot 254. A straight slot section 256 extends vertically; a curved slot section 258, which connects to the upper end 260 of the straight slot section 256, forms a 180° bend away from the door 200. (The two sections 256, 258 have the appearance of a cane.) The brace 240 is a rod that is curved at both ends 262, 264. The first end 262 hooks through the connector 238 on a bottom surface 266 of the tray 206. For example, the connector 238 is an eye-hook that attaches to the center of the bottom surface 266. The brace 240 can rotate about the first end 262. The second end 264 hooks through the cane-shaped slot 254.

The tray 206 extends between an extended position (shown in FIG. 14) and a retracted position (shown in FIG. 16). In the extended position, the tray 206 is horizontal. The brace 240 extends from the center of the bottom surface 266 to the curved section 258 of the slot 254. The brace 240 is approximately 45° relative to the tray 206. The second end 264 of the brace 240 rests within the curved section 258 upon a terminal end 268 of the cane-shaped slot 254. The slotted mount 236 provides a normal force that supports the tray 206 in the extended position. The brace 240 transfers the normal force from the slotted mount 236 to the tray 206.

In the retracted position, the tray 206 is vertical. The bottom surface 266 of the tray 206 rests against two rubber stops 270 located on either side of the recess 248. The tray 206 overlaps the sides 272 of the recess 248. Therefore, the tray 206 and the laptop 288 are external to the recess 248. However, the brace 240 is within the recess 248, and the end 264 of the brace 240 resides within the straight section 256. In addition, in an alternate embodiment, the length of the brace 240 can extend to the bottom end of the straight section 256. If the brace 240 rests upon the terminal end of the straight section 256, both the brace 240 and the hinge mechanism 208 will support the weight of the tray 206 and laptop computer 228. If the brace 240 does not rest at the bottom end of the straight section 256, hinge mechanism 208 will support the weight of the tray 206 and laptop computer 228.

In operation, the tray 206 pivots about the hinge mechanism 208 between the extended and retracted positions. The operator opens the cabinet door 100, and pulls the front edge 224 of the tray 206 upward to a position above horizontal. The brace 240 will reach the crest 274 of the cane-shaped slot 254 and prevent further upward rotation of the tray 206. As the tray 206 is pulled upward, the end 264 of the brace 240 will drop over the crest 274 and toward the short end 268 of the slot 254. The operator then lowers the front edge 224 of the tray 206, and the brace 240 engages terminal end 268 to lock the tray 206 in an extended position.

To lower the tray 206, the operator pulls the front edge 224 above the horizontal position to detach the brace 240 from the terminal end 268. The operator pushes the brace 240 toward the straight section 256 of the slot 254, and lowers the tray 206 to the vertical position. Because the tray 206 lowers to the vertical position for storage, as opposed to rising to the vertical position for storage, the platform 204 does not obstruct the air vent 250 that is above the platform 204.

Other embodiments are within the scope of the invention. The tray and the electrical component can be partially or fully reside within the recess when the tray is in the vertical position. The tray 206 can be located in other parts of the cabinet. The platform 204 can include a frame or other support mechanism other than a tray 206. The electrical component 228 can be stored in other than the vertical position. The electrical component 228 can be extended to a position other than the horizontal position. The slotted mount 236 can have configurations other than a cane shaped slot 254 such as a series of slots extending from the straight section 256 to provide an array of locked positions. A different hinge mechanism may be used.

Door Stop

Figure 17:
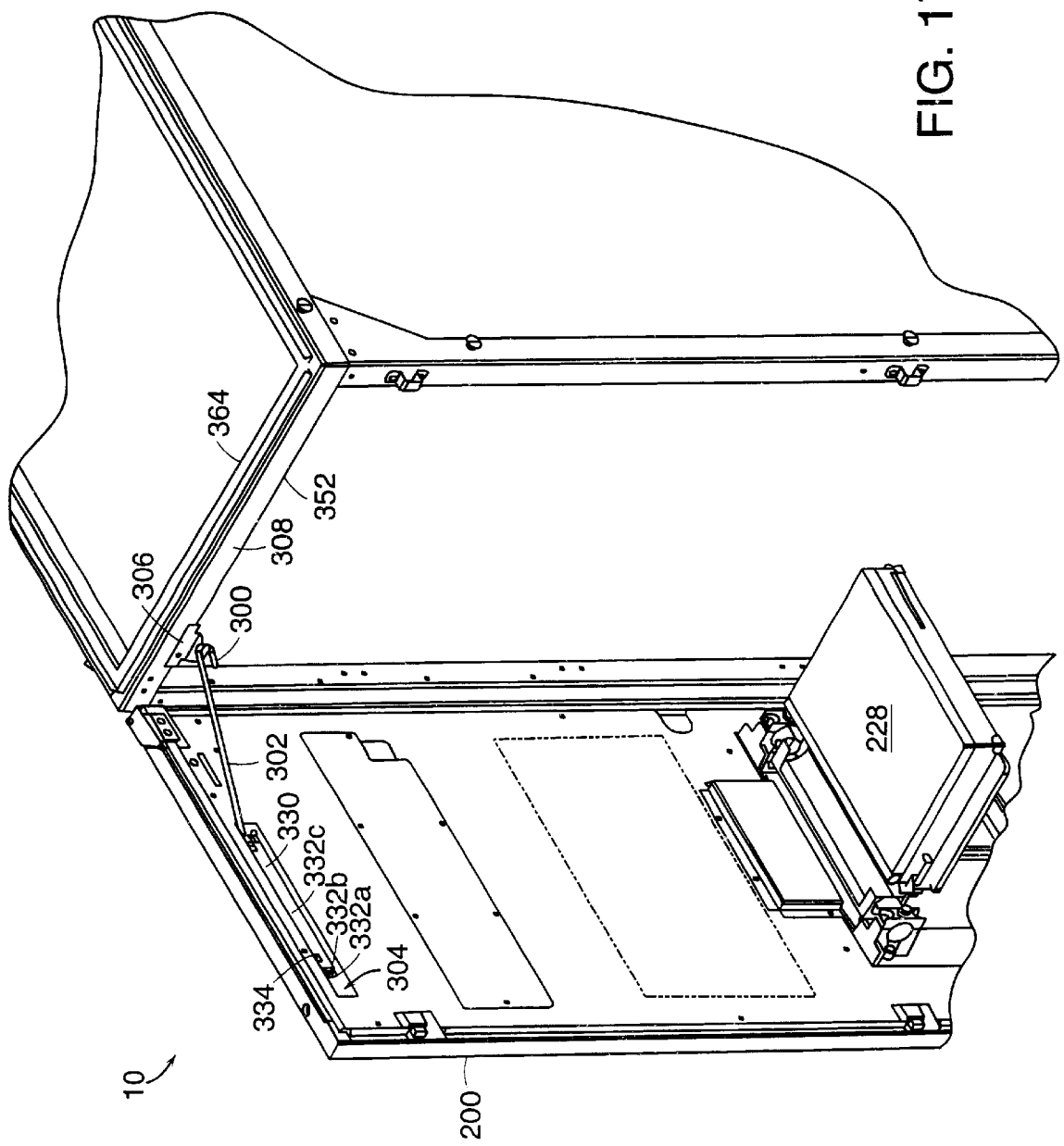
FIG. 17 is an isometric view, partially broken away, of a door for an electrical cabinet of FIGS. 1A and 1B shown locked in an open position.

Referring to FIGS. 14 and 17, the door 200 also includes a door stop 300 that secures the door 200 in the open position, e.g., to allow an operator to work within the cabinet 10 or to stabilize a platform 204 that supports a laptop computer 228. The door stop 300 includes a brace 302, a brace recess 304, and a brace hook 306. The recess 304 is a rectangular space defined by the door 200. The hook 306 attaches to the doorjamb 308. One end 310 of the brace 302 attaches to the door 200 within the recess 304. The second end 312 of the brace 302 attaches to the hook 306. When the brace 302 is attached from the door 200 to the doorjamb 308, the door 200 remains in a fixed position relative to the cabinet 10.

Figure 18:
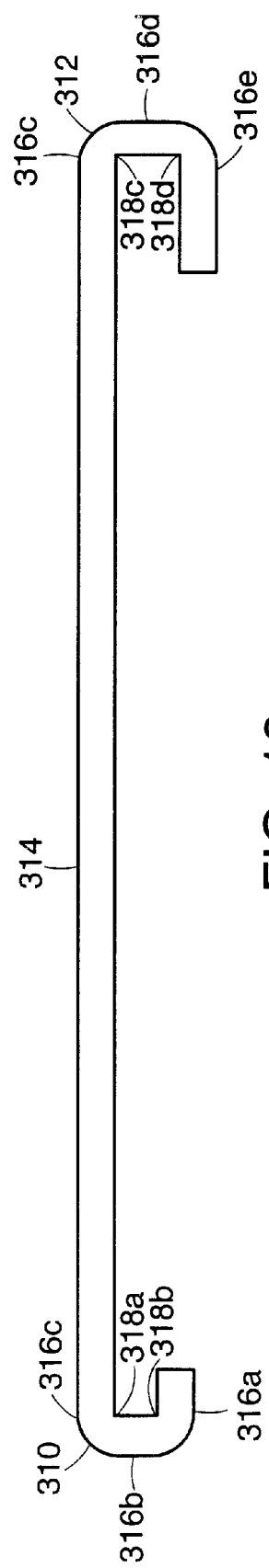
FIG. 18 is a schematic sketch of a brace depicted in FIG. 17.

Referring to FIG. 18, the brace 304 is a rod that has two hooked ends 310, 312 and a straight section 314. The rod is, e.g., low carbon cold finished steel with an electrodeposited zinc coating. The brace 302 has the appearance of the letter "C". The ends 310, 312 are squared in appearance and the brace turns 180° through five flat sections 316a–316e that form four right angles 318a–318d. One end 310 forms a hook having a center section 316b that is 0.82" in length and an end section 316a that is 0.63" in length. The other end 312 forms a hook having a center section 316d that is 0.94" in length and an end section 316e that is 1.14" in length. The brace 302 is 0.25" in diameter and 9.75" in length.

Figure 19:
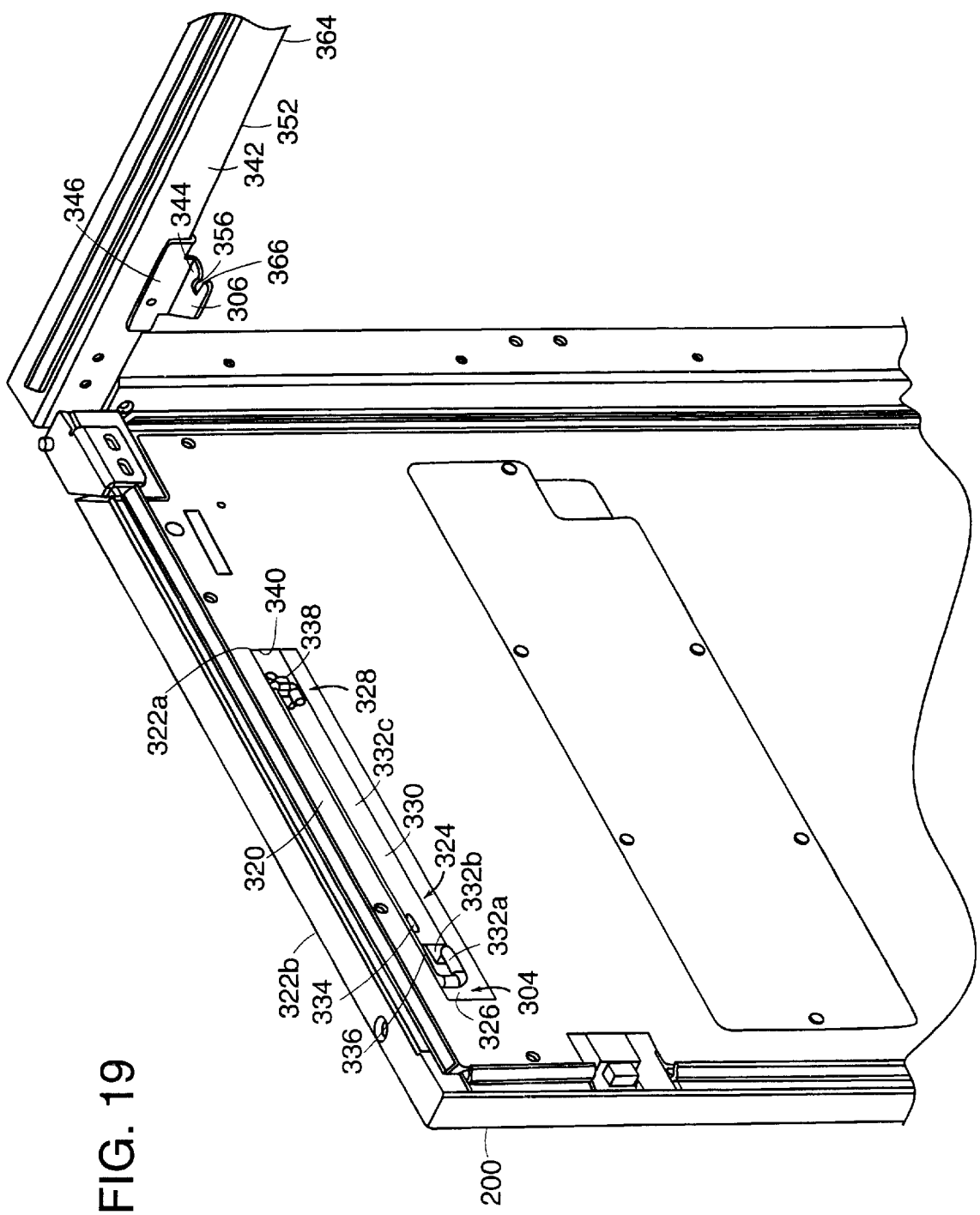
FIG. 19 is an isometric view, partially broken away, of the brace of FIG. 18 stored in the door of FIG. 17.
Figure 20A:
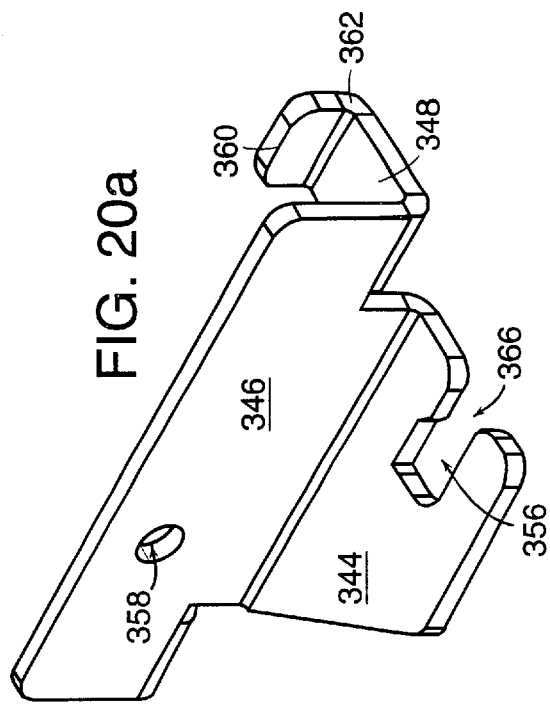
FIG. 20A is a isometric view of a hook shown in FIG. 17.
Figure 20D:
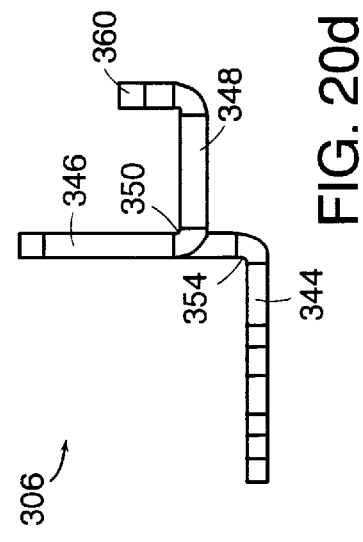
Figure 20B:
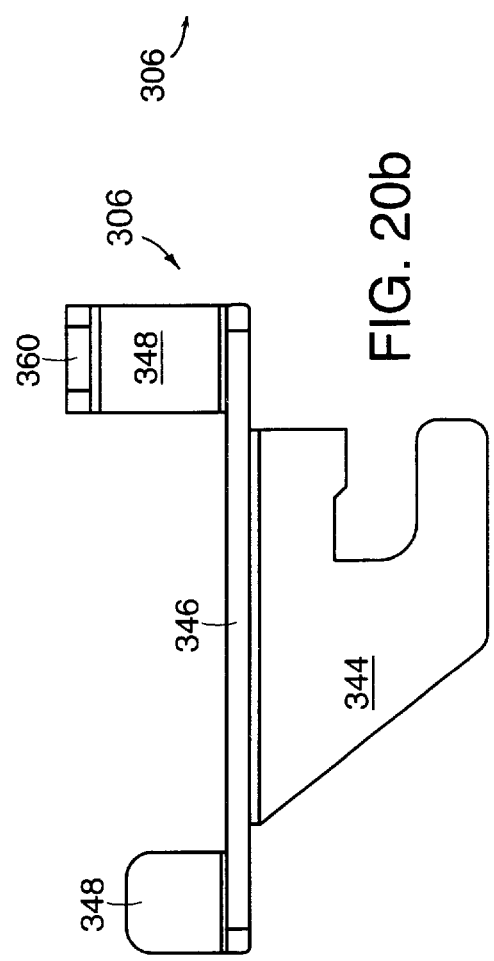
Figure 20C:
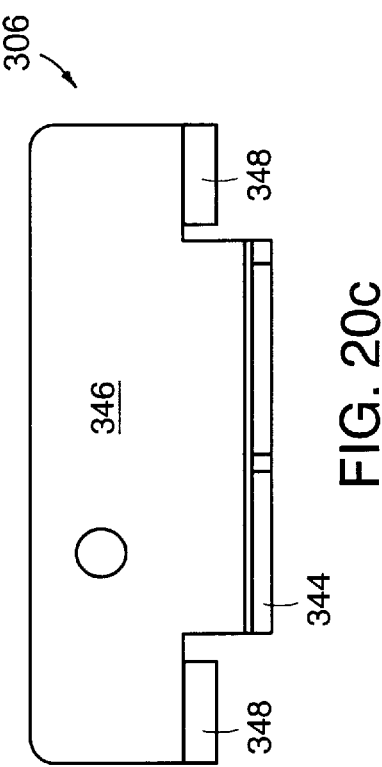

Referring to FIG. 19, the recess 304 extends horizontally along the top edge 320 of the door 200. The door 200 has two layers of metal, an inside layer 322a and an outside layer 322b, that are separated by a space 328. The recess 320 is formed by an opening 324 cut into the inside layer 322a. The outside layer 322b forms the bottom 326 of the recess 304.

An elongated bracket 330 is mounted to the bottom 326 of the recess 304 by, e.g., a screw or a spot weld. The bracket 330 supports the brace 302; the brace 302 mounts to the bracket 330 and hangs on the bracket 330 during storage when the door 200 is closed. The bracket 330 contains three perpendicular sections 332a–332c that form a stepped pattern. The first section 332a mounts to the bottom 326 of the recess 304. The second section 332b extends perpendicular to the bottom 326 and parallel to the top edge 320. The third section 332c extends parallel to the bottom 326 and upward from the second section 332b.

A support member 334 extends from one end 336 of the bracket 330. The support member 334 extends perpendicular to the third section 332c and away from the bottom 326 of the recess 304. The support member 334 is a ledge that supports the brace 302 during storage. In addition, the support member 334 is flexible and pinches the brace 302 to further secure the brace 302 during storage.

A connector 338, e.g. an eye-hook, attaches one end 310 of the brace 302 to the third section 332c of the stepped bracket 330. The brace 302 attaches to the end 340 of the bracket 330 that is opposite the flag 334 and that is nearest the hinge 202. The brace 302 rotates about the attached end 310 of the bracket 302. The recess 304 contains the brace 302 when the brace 302 is in a stored position (shown in FIG. 19). In other words, the recess 304 is larger than 9.75" in length and 0.94" in width. In addition, the depth between the third surface 332c and the opening 324 of the recess is greater than 0.25" to accommodate the thickness of the brace 302. The brace 302 rotates to a position within the recess 304 and hangs on the flag 334 during storage. The opposite end 312 of the brace 302 extends beyond the end 336 of the stepped bracket 330 to allow an operator to grasp the brace 302 and pull it from the recess 304.

The hook 306 attaches to the top edge 342 of the doorjamb 308. Referring also to FIGS. 20a–20d, the hook has three integrally formed sections: a hook section 344, a plate section 346, and a bracket section 348. The plate section 346 and the bracket section 348 intersect to form a right angle 350. The hook 306 mounts to a corner surface 352 of the doorjamb 308 along the right angle 350. A screw secures the hook 306 to the corner surface 352 through hole 358. A lip 360 extends parallel to the plate section on the opposite side 362 of the bracket section 348. The lip 360 supports the hook along an internal side 364 of the doorjamb 308. Thus, the lip 360 opposes forces which tend to pull the hook 306 away from the doorjamb 308.

The hook section 344 extends at a right angle 354 from the plate section 346 away from the doorjamb 308. The hook section 344 defines a notch 356. The opening 366 of the notch 356 is 0.27" in width. The notch 356 curves from the opening 366 toward the plate section 346. The notch 356 faces away from the hinge 202 where the door 200 intersects with the doorjamb 308.

Referring to FIGS. 17 and 19, the hook 306 rotates from the stored position in the recess 304 to the locked position with the brace 302 extended between the door 200 and the doorjamb 308. The end 312 of the brace 302 moves through the opening 366 of the notch 356. The notch 356 is curved toward the doorjamb 308, and the opening 366 is only slightly larger (0.02") than the diameter of the brace 102. Therefore, motion of the door 200 will tend to push the end 312 of the brace 302 toward the doorjamb 308 or pull the end 312 toward the door 200. The end 312 of the brace 302 will not tend to exit the opening 366 of the notch 356 because the curve of the notch 356 guides the brace 302 away from the opening. In addition, when in the locked position, the brace 302 is approximately 600 relative to the doorjamb 308. Therefore, when the door 200 exerts force on the brace 302, the force component perpendicular to the doorjamb 308 will be larger than the force component parallel to the doorjamb 308. Thus, the force tending to push the brace 302 through the notch opening 366 will be relatively smaller than the force tending to push the brace 302 toward the back of the notch 356.

Other embodiments are within the scope of the invention. For example, each end 310, 312 could form a semi-circular curve or an "L" shape having a single 90° angle. The brace 240 used in the pivoting platform 204 could have the same structure as brace 302. The brace 302 could be straight without curved ends. The recess could be disposed within the doorjamb 108 or other locations on the cabinet 10. The hook 306 could be disposed on the door 200 or at other locations on the cabinet 10. The hook could be a hole in surface of the cabinet 10. The door can rotate though a non-horizontal plane.

Bulkhead Connector

Figure 21B:
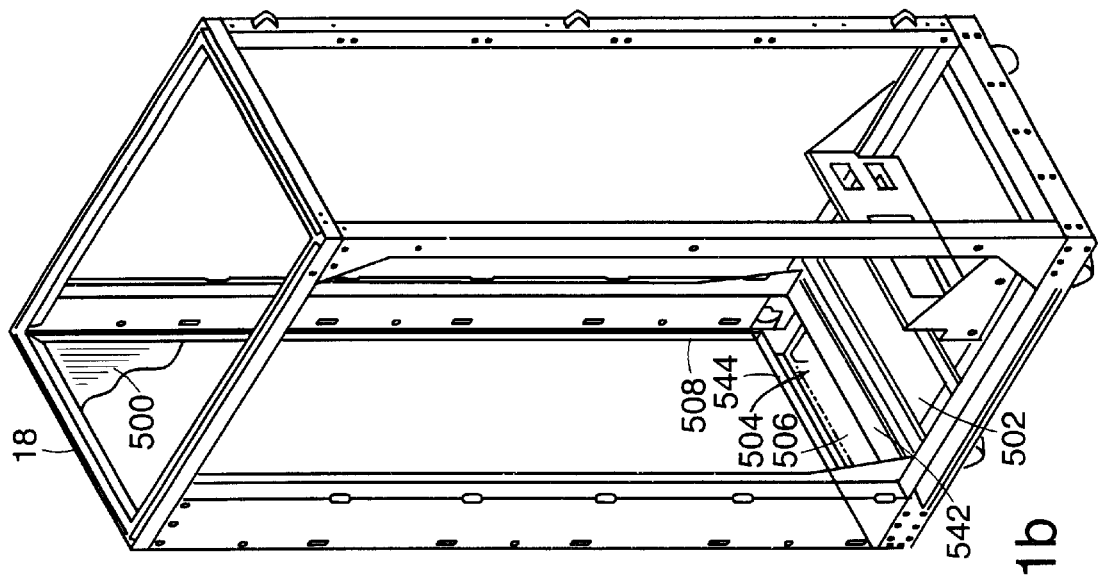
FIGS. 21A and 21B are isometric views of a frame of the electrical cabinet of FIG. 1A.
Figure 21A:
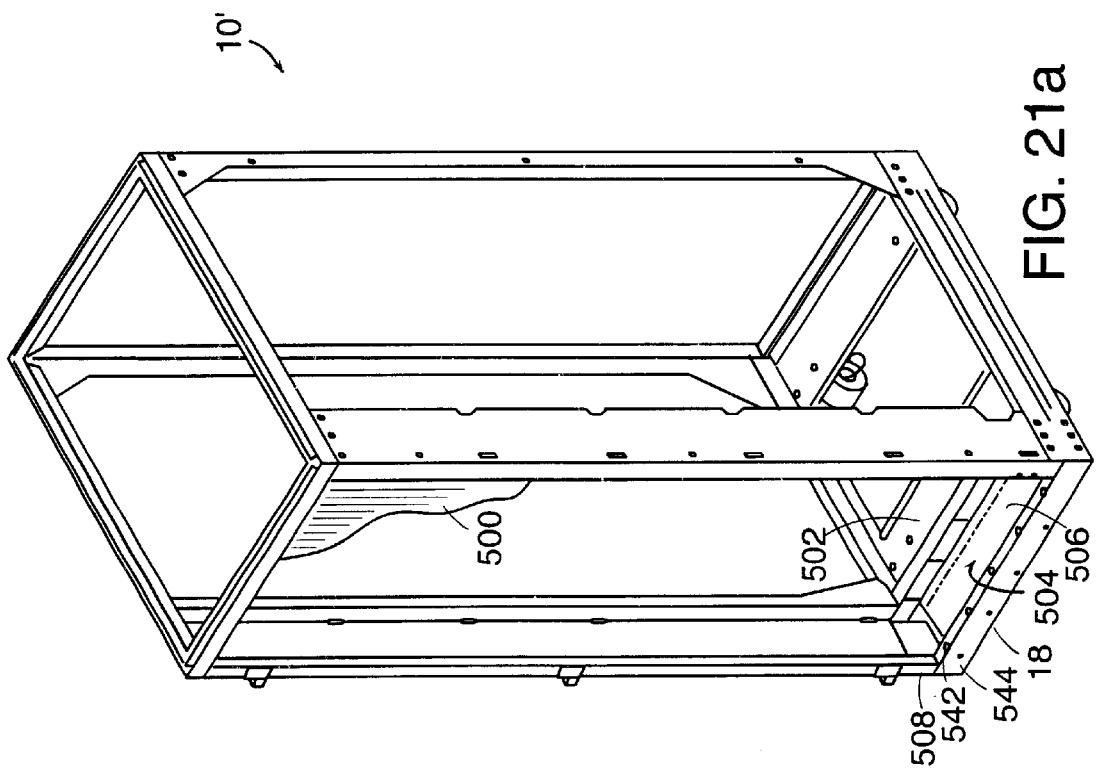

Referring to FIGS. 11a–11b, the components 82 of the cabinet 10 are adapted for electrical interconnection to electrical components that are external of the cabinet 10. To accommodate the interconnection, referring also to FIGS. 21a–21b, a frame 10' of the cabinet 10 provides support for the sidewalls and other structures of the cabinet 10. Within the frame 10', a pair of panels 500, 502 form a passage 504 in the bottom wall of the cabinet 10. For example, the panels 500, 502 are perpendicular but do not intersect. Rather, the passage 504 lies between the panels 500, 502. The panel 500 is one of the sidewalls 88 of the cabinet 10 and the panel 502 is the bottom wall of the cabinet 10.

Typically, the cabinet 10 includes a bulkhead 506 that extends across the passage 504. The bulkhead 506 is a solid surface that eliminates most of the space of passage 504. However, the bulkhead 506 is smaller than the passage 504. Therefore, an end-passage 508 remains when the bulkhead 506 extends across the passage 504 between the panels 500, 502. The end-passage 508 allows cables, which can be connected to external components, to exit the cabinet 10. For example, the bulkhead is disposed across the passage 504 at the back 18 of the cabinet 10 adjacent to the electrical connectors 20 that engage the PCBs 12 (shown in FIG. 2). The electrical connectors 20 couple to cables that may extend through the end-passage 508.

The inventors have discovered that running a plurality of cables 524 (as shown in FIG. 1) through the end-passage 508 can result in electromagnetic interference that degrades the electrical signals within the cables. The electromagnetic interference is greater in cables that carry relatively higher frequency signals.

Figure 22:
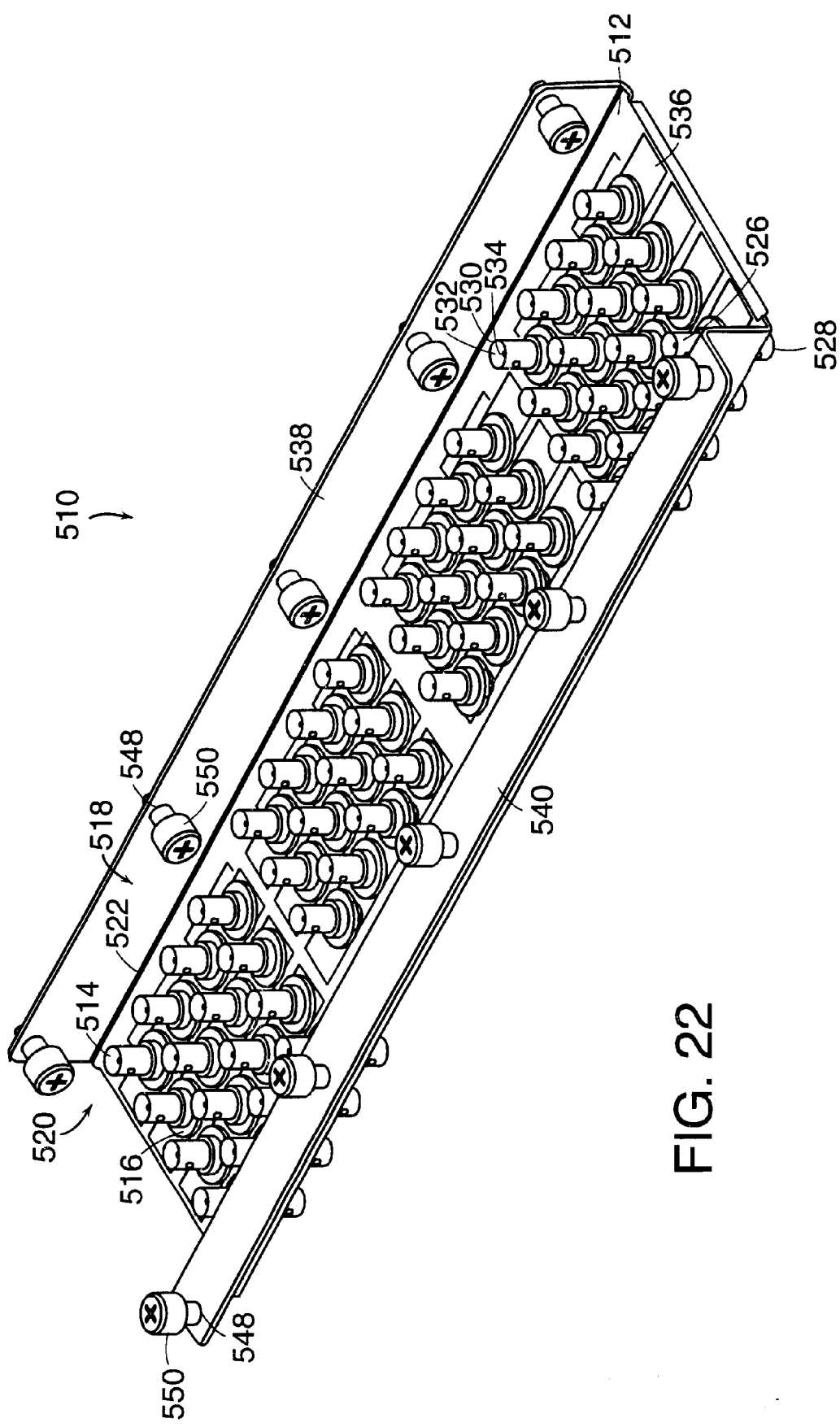

Therefore, referring to FIG. 22, the cabinet 10 includes a bulkhead connector 510 that allows the cables 524 to be spaced to reduce or eliminate electromagnetic interference between the cables. The bulkhead connector 510 includes a metal base 512 and an array of connectors 514. The base 512 has an array of openings 516 arranged in a pattern of evenly spaced columns 518 and rows 520. The size of the openings 516 corresponds to the external circumference 522 of the connectors 514, and the connectors 514 extend through the openings 516.

The electrical connectors 514 are adapted to transmit electrical signals, especially radio frequency (RF) signals, to and from the electrical components 82. The connectors 514 have two ends 526, 528 that connect two coaxial cables together. The proximal end 526 extends into the cabinet 10, the distal end 528 extends outside the cabinet 10. The electrical connectors 514 are, e.g., standard connectors that connect coaxial cable. The connectors 514 are electrically isolated from one another. Each connector 514 includes an outer conductor 530, a dielectric 532 within the outer conductor 530, and an inner conductor 534 within the dielectric 532. Typically the outer conductor 530 is electrically coupled with the metal base 512 to provide a ground for the shielding conductor of the coaxial cable. The dielectric 532 electrically isolates the inner conductor 534 from the metal base 512 and the outer conductor 530. The inner conductor 534 provides a conduction path through the bulkhead connector 510.

The bulkhead connector 510 also includes markings 536 that provide a reference for interconnecting components 82 through the bulkhead connector 510. For example, when the bulkhead connector 510 connects PCBs 12 (shown in FIG. 2) to external components, the columns 518 contain markings 536 that indicate a left or right adapter connection, and the rows 520 contain markings 536 that indicate the slot number of the PCB 12.

The base 512 connects to the panels 500, 502 along a pair of flanges 538, 540. The flanges 538, 540 are perpendicular and extend along opposing sides of the base 512. The vertical flange 538 connects along the bottom panel 502. A bottom frame section 542 (shown in FIG. 21a–21b) supports the vertical flange 538. The horizontal flange 540 connects along the sidewall panel 500. A frame section 544 (shown in FIG. 21*a*–21*b*) that extends along the lower back corner 546 of the cabinet 10 supports the horizontal flange 540. Each flange 538, 540 contains a set of four holes 548 and four captive connectors 550 within the holes 542. The captive connectors 550 are, e.g., screws that are fixed within the holes 548 but that may rotate within the holes 548. The connectors 550 fix the base 512 to the cabinet 10, and the base 512 is removable from the cabinet 10 by manually unscrewing the connectors 550.

The base 512 is smaller than the passage 504. Therefore, as with the bulkhead 506, the end-passage 508 remains as a passage for passing a plurality of cables. Generally, the end-passage 508 passes relatively lower frequency cables that are less affected by the electromagnetic interference than the relatively higher frequency cables, e.g., the coaxial cables connected to the PCBs 12.

Thus, in operation, one of the components 82 can be efficiently interconnected to an external component. For example. A higher frequency coaxial cable can extend from the component 82 to the proximal end 526 of one of the connectors 514. A second coaxial cable can attach from the corresponding distal end 528 of the connector 514 to an external component. Lower frequency cables can be connected through the bulkhead connector 510 or through the end-passage 508.

Figure 23:
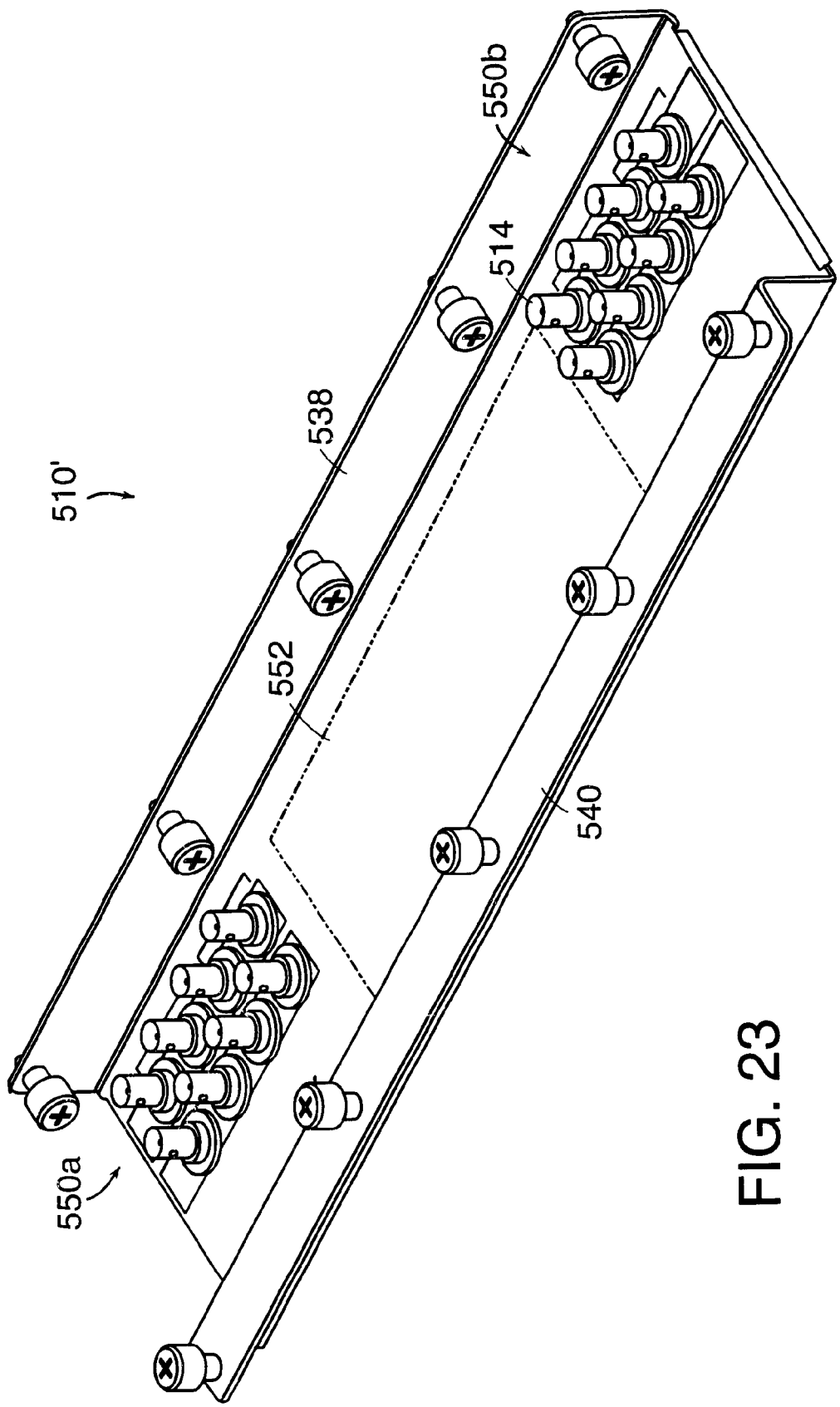

Other embodiments are within the scope of the invention. For example, alternate configurations of connectors are possible. Referring to FIG. 23, bulkhead connector 510' groups connectors 514 into two groups 550*a*–550*b*. The groups are disposed on either side of area 552. Alternately, the bulkhead connector 510' covers the entire passage 504 and area 540 is an open space that accommodates lower frequency cables.

In addition, the bulkhead connector can accommodate other types of cable, e.g., twisted pair or fiber optic cables. The bulkhead connector may be permanently fixed to the cabinet. The bulkhead connector can be place in other locations within the cabinet 10, including along the sidewalls of the cabinet 10. The orientation of the flanges can be parallel or some other configuration.

What is claimed is:

1. A pivoting platform in an electronic equipment cabinet comprising:
   a rear edge portion of the platform;
   a hinge attaching the rear edge portion of the platform to a wall of the cabinet, such wall having a recess disposed therein;
   a forward edge portion of the platform;
   wherein the platform is rotatable about the hinge having a range of positions that extend between a retracted vertical position and an extended horizontal position, the forward edge portion of the platform being disposed beneath the rear edge portion of the platform when the platform is in the retracted position;
   a bracket defining a slot extending substantially in a vertical direction, the slot having a curved section and an elongated section, the curved section disposed above the elongated section, the curved section having a terminal end located above a terminal end of the elongated section, a portion of the bracket being disposed within the recess in the wall of the cabinet; and
   a brace having a first end and a second end, the first end extending through the slot, the second end attached to the platform by a connector, the first end disposed at a terminal end of the curved section of the slot when the platform is in an extended position, the first end disposed along the straight section of the slot when the platform is in a retracted position.

2. The platform of claim 1 further comprising a set of securing members adapted to secure an electrical component to the platform.

3. The platform of claim 2 wherein the securing members are brackets mounted at opposing corners of the platform.

4. The platform of claim 1 wherein the range of positions extends 90 degrees.

5. The platform of claim 1 wherein the extended position is substantially horizontal.

6. The platform of claim 1 wherein the retracted position is substantially vertical.

7. The platform of claim 1 further comprising a solid upper surface adapted to support an electrical component.

8. The platform of claim 1 wherein the second end of the brace is pivotably attached to the platform, the brace adapted to pivot relative to the platform when the platform moves from the extended to the retracted position.

9. A pivoting platform in an electronic equipment cabinet comprising:
   a rear edge portion of the platform;
   a hinge attaching the rear edge portion of the platform to a wall of the cabinet, such wall having a recess disposed therein;
   a forward edge portion of the platform;
   wherein the platform is rotatable about the hinge having a range of positions that extend between a retracted vertical position and an extended horizontal position, the forward edge portion of the platform being disposed beneath the rear edge portion of the platform when the platform is in the retracted position;
   a bracket defining a slot extending substantially in a vertical direction, the slot having a curved section and a straight section, the curved section disposed above the straight section, a portion of the bracket being disposed within the recess in the wall of the cabinet;
   a brace having a first end and a second end, the first end extending through the slot, the second end attached to the lower surface of the platform by a connector, the first end disposed at a terminal end of the curved section of the slot when the platform is in an extended position, the first end disposed along the straight section of the slot when the platform is in a retracted position; and
   a set of brackets mounted at opposing corners of the platform, the brackets adapted to secure the one component to the platform.

\* \* \* \* \*